United States Patent
Park et al.

(10) Patent No.: US 11,728,795 B2
(45) Date of Patent: Aug. 15, 2023

(54) VOLTAGE LEVEL SHIFTER CELL AND INTEGRATED CIRCUIT INCLUDING THE SAME

(71) Applicant: SAMSUNG ELECTRONICS CO., LTD., Suwon-si (KR)

(72) Inventors: Chanhee Park, Incheon (KR); Ahreum Kim, Daegu (KR); Minsu Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/564,915

(22) Filed: Dec. 29, 2021

(65) Prior Publication Data

US 2022/0271742 A1    Aug. 25, 2022

(30) Foreign Application Priority Data

Feb. 22, 2021    (KR) .......................... 10-2021-0023689

(51) Int. Cl.
*H03K 19/0175*    (2006.01)
*H03K 3/356*    (2006.01)
*H01L 27/02*    (2006.01)
*G06F 30/30*    (2020.01)

(52) U.S. Cl.
CPC ....... *H03K 3/356113* (2013.01); *G06F 30/30* (2020.01); *H01L 27/0207* (2013.01); *H03K 19/0175* (2013.01)

(58) Field of Classification Search
CPC ....... H03K 19/0175; H03K 19/017509; H03K 19/0185; H03K 19/018507; H03K 3/356113; H01K 27/0207; G06F 30/30; G06F 30/32; G06F 30/34; G06F 30/347
See application file for complete search history.

(56) References Cited

U.S. PATENT DOCUMENTS

| | | | |
|---|---|---|---|
| 6,941,534 B2 | 9/2005 | Awa | |
| 8,487,658 B2 * | 7/2013 | Datta | ................ H01L 27/0207 326/63 |
| 9,831,877 B2 | 11/2017 | Lee et al. | |
| 10,109,619 B2 | 10/2018 | Pant et al. | |
| 2015/0109045 A1 | 4/2015 | Vilangudipitchai et al. | |
| 2020/0328746 A1 * | 10/2020 | Park | ................ H03K 19/0016 |

FOREIGN PATENT DOCUMENTS

| | | |
|---|---|---|
| JP | 2002-190572 | 7/2002 |
| JP | 2007-173485 | 7/2007 |
| KR | 10-2017-0036420 | 4/2017 |

* cited by examiner

*Primary Examiner* — Long Nguyen
(74) *Attorney, Agent, or Firm* — F. Chau & Associates, LLC

(57) ABSTRACT

A voltage level shifter cell, which is configured to convert voltage levels of input signals of multi-bits, includes: a first circuit area including a first voltage level shifter configured to convert a 1-bit first input signal from among the input signals; and a second circuit area including a second voltage level shifter configured to convert a 1-bit second input signal from among the input signals, wherein the first circuit area and the second circuit area share a first N-well to which a first power voltage is applied, and the first circuit area and the second circuit area share a second N-well to which a second power voltage is applied, wherein the first N-well is formed to extend in a first direction, and the first N-well and the second N-well are arranged to overlap in a second direction crossing the first direction.

20 Claims, 14 Drawing Sheets

VOLTAGE LEVEL SHIFTER CELL AND INTEGRATED CIRCUIT INCLUDING THE SAME

CROSS-REFERENCE TO RELATED APPLICATION

This application claims priority under 35 U.S.C. § 119 to Korean Patent Application No. 10-2021-0023689, filed on Feb. 22, 2021 in the Korean Intellectual Property Office, the disclosure of which is incorporated by reference herein in its entirety.

TECHNICAL FIELD

The present inventive concept relates to a voltage level shifter cell and an integrated circuit including the same, and more particularly, to a multi-bit voltage level shifter cell and an integrated circuit including the same.

DISCUSSION OF THE RELATED ART

As semiconductor fabrication technologies are improved, sizes of transistors may decrease, and accordingly, a larger number of transistors may be integrated in semiconductor devices. For example, a system on chip (SoC), which is an integrated circuit (IC) integrating all components of a computer or another electronic system to one chip, is widely used for small and various applications, and accordingly, performance of the applications may be increased. As the performance of the applications is increased, semiconductor devices including more components may be desired.

In addition, various methods for reducing power consumed by the semiconductor devices used for applications such as portable electronic equipment have been under development. For example, to reduce the power consumption of a semiconductor device, the components included in the semiconductor device may be driven by using a plurality of power voltages, and the used components may block the supplied power source voltage.

SUMMARY

According to an exemplary embodiment of the present inventive concept, a voltage level shifter cell, which is configured to convert voltage levels of input signals of multi-bits, includes: a first circuit area including a first voltage level shifter configured to convert a 1-bit first input signal from among the input signals; and a second circuit area including a second voltage level shifter configured to convert a 1-bit second input signal from among the input signals, wherein the first circuit area and the second circuit area share a first N-well to which a first power voltage is applied, and the first circuit area and the second circuit area share a second N-well to which a second power voltage is applied, wherein the first N-well is formed to extend in a first direction, and the first N-well and the second N-well are arranged to overlap in a second direction crossing the first direction.

According to an exemplary embodiment of the present inventive concept, a voltage level shifter cell includes: a first N-well receiving a first power voltage; and a second N-well receiving a second power voltage is applied, wherein the second power voltage is different from the first power voltage, wherein the first N-well receives the first power voltage from a first power line formed to extend in a first direction, and the first N-well and the second N-well are formed to overlap each other in a second direction substantially perpendicular to the first direction.

According to an exemplary embodiment of the present inventive concept, an integrated circuit includes: a first standard cell included in a first power voltage domain; a second standard cell included in a second power voltage domain; and a voltage level shifter cell configured to convert voltage levels of input signals of multi-bits input from the second standard cell to output signals, and configured to output the output signals to the first standard cell, wherein the voltage level shifter cell includes: a first N-well receiving a first power voltage and extending in a first direction; and a second N-well receiving a second power voltage, wherein the first N-well and the second N-well overlap each other in a second direction substantially perpendicular to the first direction.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Hereinafter, exemplary embodiments of the present inventive concept will be described in detail with reference to the accompanying drawings.

Figure 1A:
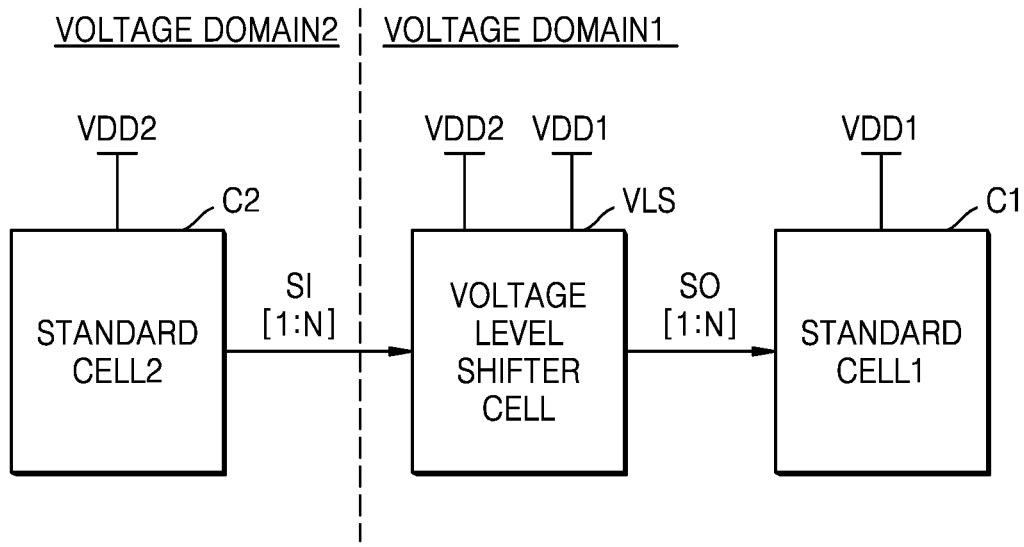
FIGS. 1A and 1B are block diagrams of integrated circuits including voltage level shifter cells, according to exemplary embodiments of the present inventive concept.
Figure 1B:
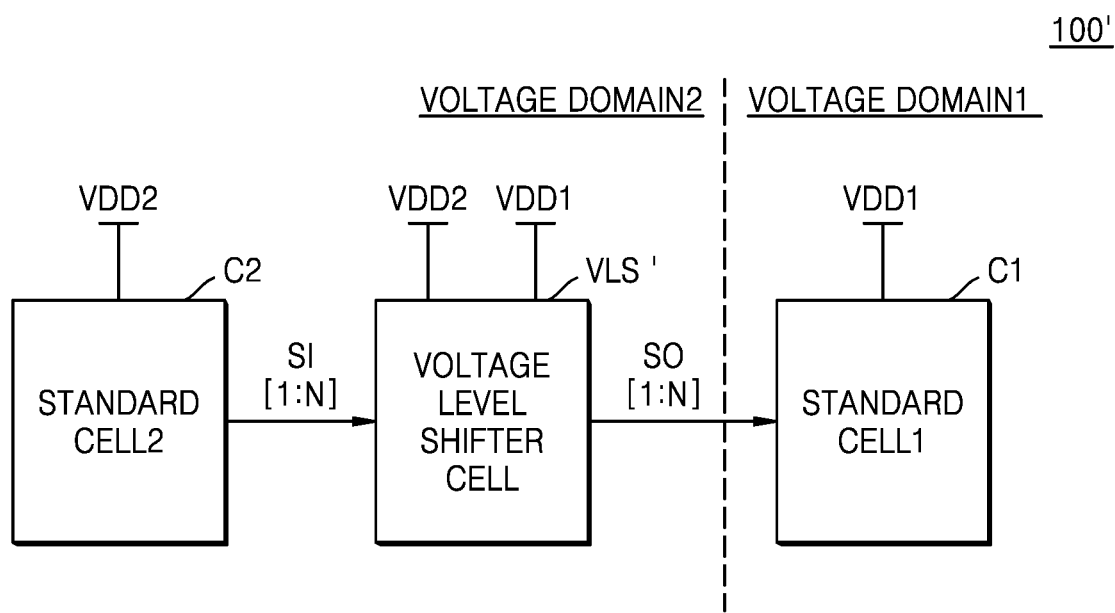

FIGS. 1A and 1B are block diagrams of integrated circuits 100 and 100' including voltage level shifter cells VLS and VLS', according to exemplary embodiments of the present inventive concept, respectively.

The integrated circuits 100 and 100' may process a digital signal, an analog signal, a combined signal, etc. The integrated circuits 100 and 100' processing a digital signal may include, for example, a processor, a memory controller, a hardware encoder and decoder, an interface block, etc. The integrated circuits 100 and 100' processing a digital signal may process the digital signal based on a voltage of the digital signal line, for example, a low voltage level or a high voltage level. The low voltage level and the high voltage level corresponding to the digital signal in this manner may be defined by a voltage level logic, and each of different voltage level logics may define different low voltage levels and/or different high voltage levels.

The integrated circuits 100 and 100' processing a digital signal may be arranged on a substrate to include a plurality of unit cells. One unit cell may correspond to a particular circuit included in an integrated circuit, and may include a layout of the particular circuit. A semiconductor design rule may provide a standard cell according to a semiconductor process by which the integrated circuits 100 and 100' are fabricated, and the standard cell may have a certain height or the like to increase the efficiency of the layout.

Referring to FIGS. 1A and 1B, the integrated circuits 100 and 100' may respectively include the voltage level shifter cells VLS and VLS', which are connected to and between a first standard cell C1 and a second standard cell C2. In this case, the first standard cell C1 may be included in a first voltage domain in which the first standard cell C1 operates at a first power voltage VDD1, and the second standard cell C2 may be included in a second voltage domain in which the second standard cell C2 operates at a second power voltage VDD2, the second power voltage VDD2 being different from the first power voltage VDD1.

The voltage level shifter cells VLS and VLS' may shift signals between the first voltage domain and the second voltage domain. For example, the voltage level shifter cells VLS and VLS' may convert input signals SI[1:N] compliant to a level logic of the second power voltage VDD2 into output signals SO[1:N] compliant to a level logic of the first power voltage VDD1, and may output the output signals SO[1:N] to the first standard cell C1 included in the first voltage domain. For example, the voltage level shifter cell VLS may convert a signal having about 0 V and about 1.8 V as the low voltage level and the high voltage level, respectively, into a signal having about 0 V and about 3.3 V as the low voltage level and the high voltage level, respectively, or may convert the signal having about 0 V and about 3.3 V as the low voltage level and the high voltage level, respectively, into the signal having about 0 V and about 1.8 V as the low voltage level and the high voltage level, respectively. In FIGS. 3 through 11 below, various examples of layouts of the voltage level shifter cells VLS and VLS' will be described.

The voltage level shifter cells VLS and VLS' may include multi-bit voltage level shifter cells. Each of the input signals SI[1:N] and the output signals SO[1:N] may include signals of N-bits, and the voltage level shifter cells VLS and VLS' may process the input signals SI[1:N] of N-bits in parallel. In this case, N may be a natural number equal to or greater than 2.

Referring to FIG. 1A, the voltage level shifter cell VLS may be included in the first voltage domain, and may operate as an input circuit of the first voltage domain receiving the input signals SI[1:N] from the outside of the first voltage domain (for example, the second voltage domain). For example, the voltage level shifter cell VLS may receive the input signals SI[1:N] from the second standard cell C2 of the second voltage domain. To perform this operation, the voltage level shifter cell VLS may receive the second power voltage VDD2 of circuits, in which the input signals SI[1:N] have been generated, and the first power voltage VDD1 of circuits, to which the output signals SO[1:N] are to be transmitted.

Referring to FIG. 1B, the integrated circuit 100' may include the voltage level shifter cell VLS' connected to and between the first standard cell C1 and the second standard cell C2. In an exemplary embodiment of the present inventive concept, the voltage level shifter cell VCS' may be included in the second voltage domain, and may operate as an output circuit of the second voltage domain outputting the output signals SO[1:N] to the outside of the second voltage domain (for example, the first voltage domain). For example, the voltage level shifter cell VLS' may output the output signals SO[1:N] to the second standard cell of the first voltage domain. To perform this operation, the voltage level shifter cell VLS' may receive the second power voltage VDD2 of circuits, in which the input signals SI[1:N] have been generated, and the first power voltage VDD1 of circuits, to which the output signals SO[1:N] are to be transmitted.

Figure 2:
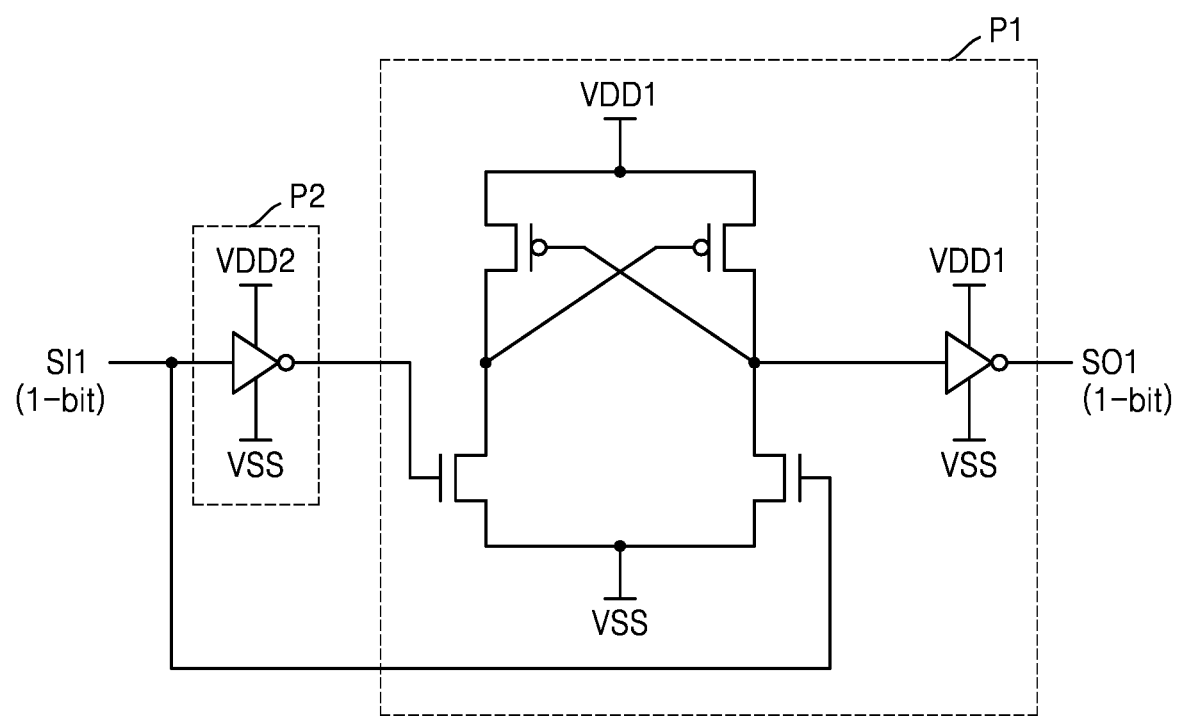
FIG. 2 is a circuit diagram of a 1-bit voltage level shifter included in a voltage level shifter cell, according to an exemplary embodiment of the present inventive concept.

FIG. 2 is a circuit diagram of a 1-bit voltage level shifter included in a voltage level shifter cell, according to an exemplary embodiment of the present inventive concept. The voltage level shifter in FIG. 2 is an example of the 1-bit voltage level shifter. The voltage level shifter cell VLS in FIG. 1A may include a multi-bit voltage level shifter cell. For example, N of the 1-bit voltage level shifters may be formed in the voltage level shifter cell VLS, and for example, the multi-bit voltage level shifter cell may be configured so that N of circuits, which are the same as or similar to the 1-bit voltage level shifter in FIG. 2, may be formed in the voltage level shifter cell VLS. N is a positive integer greater than zero.

An input signal SI1 in FIG. 2 may be a portion of the input signals SI[1:N] in FIG. 1A, and an output signal SO1 in FIG. 2 may be a portion of the output signals SO[1:N] in FIG. 1A. The input signals SI[:N] in FIG. 1A may include N input signals, and each of the N input signals may be input to the 1-bit voltage level shifter corresponding to one of the N 1-bit voltage level shifters.

Referring to FIG. 2, the 1-bit voltage level shifter may convert the 1-bit input signal SI1 into the 1-bit output signal SOL. For this operation, the 1-bit voltage level shifter may receive the second power voltage VDD2, which is a power voltage of circuits in which the input signal S1 has been generated, and the first power voltage VDD1, which is a power voltage of circuits to which the output signal SO1 is to be transmitted.

In the 1-bit voltage level shifter, a current may flow from the first power voltage VDD1 and/or the second power voltage VDD2 to a ground voltage VSS. For example, the 1-bit voltage level shifter may include a first portion P1 including a transistor receiving the current from the first power voltage VDD1. The 1-bit voltage level shifter may further include a second portion P2 including a transistor receiving the current from the second power voltage VDD2. The first power voltage VDD1 may correspond to the high voltage level defined by the voltage level logic to which the output signal SO1 is compliant, and the second power voltage VDD2 may correspond to the high voltage level defined by the voltage level logic to which the input signal SI1 is compliant.

Because the 1-bit voltage level shifter includes the first portion P1 and the second portion P2, the voltage level shifter cell in which the 1-bit voltage level shifter is formed may include a plurality of N-wells to which different power voltages from each other are applied. According to an exemplary embodiment of the present inventive concept, when the N-wells, to which different power voltages from each other are applied, are implemented as multi-bit voltage level shifter cells arranged in parallel in a Y-axis direction, in the voltage level shifter cell, an area occupied by the voltage level shifter cell may be reduced, and an area of the integrated circuit including the voltage level shifter cell may be reduced.

Figure 3:
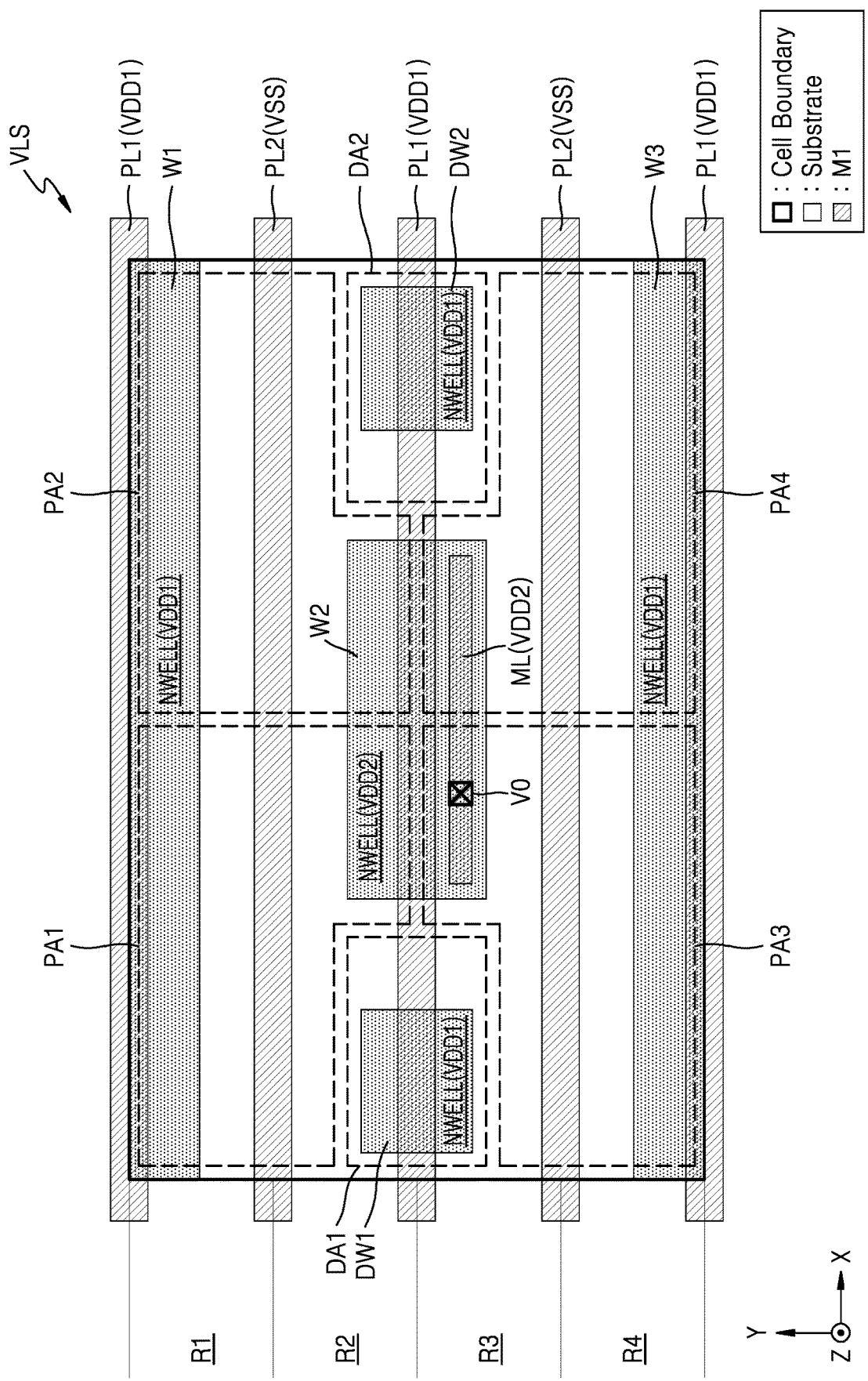
FIGS. 3, 4, 5, 6, 7, 8, 9, 10 and 11 are plan views of layouts of voltage level shifter cells, according to exemplary embodiments of the present inventive concept.

FIG. 3 is a plan view of a layout of the voltage level shifter cell VLS, according to an exemplary embodiment of the present inventive concept.

FIG. 3 is a plan view of a layout of the voltage level shifter cell VLS on a plane formed by an X-axis and the Y-axis. In an exemplary embodiment of the present inventive concept, the X-axis direction and the Y-axis direction may be referred to as a first horizontal direction and a second horizontal direction, respectively, and a Z-axis direction may be referred to as a vertical direction. A plane formed by the X-axis and the Y-axis may be referred to as a horizontal plane. Further, when a component is referred as being above the other components, that component may be arranged in a +Z-axis direction relative to other components, and when a component is referred to as being under the other components, that component may be arranged in a −Z-axis direction relative to the other components. Unless otherwise stated, a height of a component may be referred to as a length of the component in the Y-axis direction. In the drawings, for example, only some layers may be illustrated for convenience of illustration, and a via may be illustrated to indicate a connection between a pattern of a metal layer and a lower conductive pattern even though the via is located under the pattern of the metal layer.

The integrated circuit (for example, 100 of FIG. 1A and 100' of FIG. 1B) may include a plurality of first power lines PL1 and a plurality of second power lines PL2. Each of the plurality of first power lines PL1 and the plurality of second power lines PL2 may extend in the X-axis direction, and arranged apart from each other in the Y-axis direction. The plurality of first power lines PL1 may include a portion of a first power rail and provide the first power voltage VDD1 to the standard cells arranged in the integrated circuits 100 and 100', and the plurality of second power lines PL2 may include a portion of a second power rail and provide the ground voltage VSS to the standard cells arranged in the integrated circuits 100 and 100'.

The first power lines PL1 and the second power lines PL2 may be alternately arranged with respect to each other in the Y-axis direction. The voltage level shifter cell VLS may receive the first power voltage VDD1 from the plurality of first power lines PL1, and receive the ground voltage VSS from the plurality of second power lines PL2. In FIG. 3, an example is illustrated in which the plurality of first power lines PL1 and the plurality of second power lines PL2 are formed in a pattern to form a first metal layer M1, but the integrated circuit of the present inventive concept is not limited thereto.

A standard cell may be a unit of a layout included in an integrated circuit, and may be simply referred to as a cell. The integrated circuits 100 and 100' may include a number of various standard cells. The standard cells may have a structure compliant to a certain standard, and may be arranged in a plurality of rows. The plurality of rows may be defined by each of the plurality of first power lines PL1 and the plurality of second power lines PL2.

The voltage level shifter cell VLS may include a multi-height cell, and may be arranged across the plurality of rows. For example, the voltage level shifter cell VLS may be arranged across first through fourth rows R1 through R4, and the first through fourth rows R1 through R4 may be provided by three of the first power lines PL1 and two of the second power lines PL2.

Referring to FIG. 3, in the voltage level shifter cell VLS defined by a cell boundary, a multi-bit voltage level shifter converting 4-bit input signals may be formed. The voltage level shifter cell VLS may include first through fourth circuit areas PA1 through PA4, and in the first through fourth circuit areas PA1 through PA4, first through fourth 1-bit voltage level shifters converting 4-bit input signals (for example, SI[1:N] in FIG. 1A, where N is 4) may be formed. For example, in the first circuit area PA1, the first voltage level shifter converting a 1-bit first input signal of the input signals SI[1:N] may be formed. As an additional example, in the second circuit area PA2, the second voltage level shifter converting a 1-bit second input signal of the input signals SI[1:N] may be formed. As another example, in the third circuit area PA3, the third voltage level shifter converting a 1-bit third input signal of the input signals SI[1:N] may be formed, and in the fourth circuit area PA4, the fourth voltage level shifter converting a 1-bit fourth input signal of the input signals SI[1:N] may be formed.

In an exemplary embodiment of the present inventive concept, the first circuit area PA1 and the second circuit area PA2 may be arranged on a first row R1 and a second row R2, and the third circuit area PA3 and the fourth circuit area PA4 may be arranged on a third row R3 and a fourth row R4.

The voltage level shifter cell VLS may include a first well W1, a second well W2, and a third well W3. A well may be an area doped with a conductivity type different from that of the substrate for arranging transistors, or the like, and for example, the first well W1, the second well W2, and the third well W3 in FIG. 3 may include N-wells (or N-type wells) formed on a P-type substrate. In each of the first well W1, the second well W2, and the third well W3, a P-type transistor (a P-channel metal-oxide semiconductor field effect transistor (MOSFET)) of transistors included in the voltage level shifter cell VLS may be arranged. Below, exemplary embodiments in which the well includes an N-well formed on a P-type substrate are described, but the present inventive concept is not limited thereto.

Each of the first circuit area PA1 and the second circuit area PA2 may include a portion of the first well W1 and a portion of the second well W2, and each of the third circuit area PA3 and the fourth circuit area PA4 may include a portion of the second well W2 and a portion of the third well W3. For example, the first circuit area PA1 and the second circuit area PA2 may share the first well W1, the third circuit area PA3 and the fourth circuit area PA4 may share the third well W3, and the first through fourth circuit areas PA1 through PA4 may share the second well W2.

The voltage level shifter cell VLS may receive a plurality of power voltages, for example, the first power voltage VDD1 and the second power voltage VDD2. According to an exemplary embodiment of the present inventive concept, the first well W1 and the third well W3 may be biased to the first power voltage VDD1 via the first power lines PL1, and the second well W2 may be biased to the second power voltage VDD2 via a metal line ML. The P-type transistors formed in the first well W1 and the third well W3 may be included in a first portion (for example, P1 in FIG. 2) to which the first power voltage VDD1 is applied, and the P-type transistor formed in the second well W2 may be included in a second portion (for example, P2 in FIG. 2) to which the second power voltage VDD2 is applied.

The voltage level shifter cell VLS may include the metal line ML operating as a pin to which the second power voltage VDD2 is applied. The metal line ML may be arranged between the first power lines PL1 and the second power lines PL2. The second well W2 may receive the second power voltage VDD2 via a first via VO formed between the metal line ML and the second well W2.

In an exemplary embodiment of the present inventive concept, the metal line ML may be formed to extend in the X-axis direction and may be patterned in the first metal layer M1. However, the voltage level shifter cell VLS according to the present inventive concept is not limited thereto, and the metal line ML may be formed to extend in the Y-axis direction. In addition, the metal line ML may be formed in a pattern of an upper layer of the first metal layer M1.

In addition, in an exemplary embodiment of the present inventive concept, the voltage level shifter cell VLS may include a contact that is arranged between the first metal layer M1 and the second well W2 and that operates as a pin to which the second power voltage VDD2 is applied. In this case, the contact may connect the first via VO to the second well W2. In addition, in an exemplary embodiment of the present inventive concept, the voltage level shifter cell VLS may include the first via VO operating as a pin to which the second power voltage VDD2 is applied.

In an exemplary embodiment of the present inventive concept, the first well W1 and the second well W2, to which different voltages from each other are applied, may overlap each other in the Y-axis direction, and the second well W2 and the third well W3, to which different voltages from each other are applied, may overlap each other in the Y-axis direction.

The voltage level shifter cell VLS may further include a first dummy area DA1 and a second dummy area DA2. According to an exemplary embodiment of the present inventive concept, the first dummy area DA1 may be adjacent to the boundary of the voltage level shifter cell VLS in the –X-axis direction, and the second dummy area DA2 may be adjacent to the boundary of the voltage level shifter cell VLS in the +X-axis direction. For example, the first dummy area DA1 may be formed to contact the boundary of the voltage level shifter cell VLS in the –X-axis direction, and the second dummy area DA2 may be formed to contact the boundary of the voltage level shifter cell VLS in the +X-axis direction. The first dummy area DA1 may overlap the first circuit area PA1 and the third circuit area PA3, and the second dummy area DA2 may overlap the second circuit area PA2 and the fourth circuit area PA4. For example, the first dummy area DA1 may be in contact with the first circuit area PA1 and the third circuit area PA3, and the second dummy area DA2 may be in contact with the second circuit area PA2 and the fourth circuit area PA4.

The first dummy area DA1 and the second dummy area DA2 may be areas where transistors allowing the voltage level shifter cell VLS to operate as a voltage level shifter are not generated. In the first dummy area DA1 and the second dummy area DA2, a first dummy well DW1 and a second dummy well DW2, where transistors are not formed, may be formed, respectively. However, unlike as illustrated in FIG. 3, the first dummy well DW1 and the second dummy well DW2 may not be formed in the first dummy area DA1 and the second dummy area DA2, respectively.

The first dummy area DA1 and the second dummy area DA2 may be areas where a particular voltage (for example, the first power voltage VDD1) is applied to the substrate or the well. For example, the first power voltage VDD1 may be applied to each of the first dummy well DW1 and the second dummy well DW2 through the first power line PL1.

The first dummy area DA1 and the second dummy area DA2 may be arranged to overlap the second well W2 in the X-axis direction. For example, the second well W2 may be arranged between the first dummy area DA1 and the second dummy area DA2. The first dummy area DA1 and the second dummy area DA2 may be formed in the second row R2 and the third row R3, and under the first power line PL1. The first dummy well DW1 and the second dummy well DW2 may be arranged to overlap the second well W2 in the X-axis direction.

For example, a layout of an integrated circuit may comply with a design rule, and standard cells including a voltage level shifter cell VLS may be arranged on a substrate based on the design rule. The design rule may provide the minimum sizes of features (or, e.g., components) arranged on the substrate, a distance between features, or the like, and may include a plurality of values dependent on characteristics of a semiconductor process for fabricating the integrated circuit. The design rule may include a well-to-well space rule, and the well-to-well space rule may provide a distance between identical conductivity wells, a distance between wells of different conductivity types, etc. The wells of the voltage level shifter cell VLS may be arranged to satisfy values provided by the design rule, for example, to correspond to a value greater than a provided value.

The voltage level shifter cell VLS according to the present inventive concept may include the first through third wells W1 through W3 of identical conductivity type (N-type) arranged in parallel in the Y-axis direction, and accordingly, it may be easier to satisfy distance conditions between identical conductivity wells provided by the design rule, compared to a comparative example in which the first through third wells W1 through W3 are arranged in parallel in the X-axis direction. Accordingly, an area of the voltage level shifter cell VLS may be reduced, unlike a comparative example in which an area of a voltage level shifter cell is increased by securing a certain distance between the N-wells that are arranged in parallel with each other in the X-axis direction to satisfy design conditions.

Figure 4:
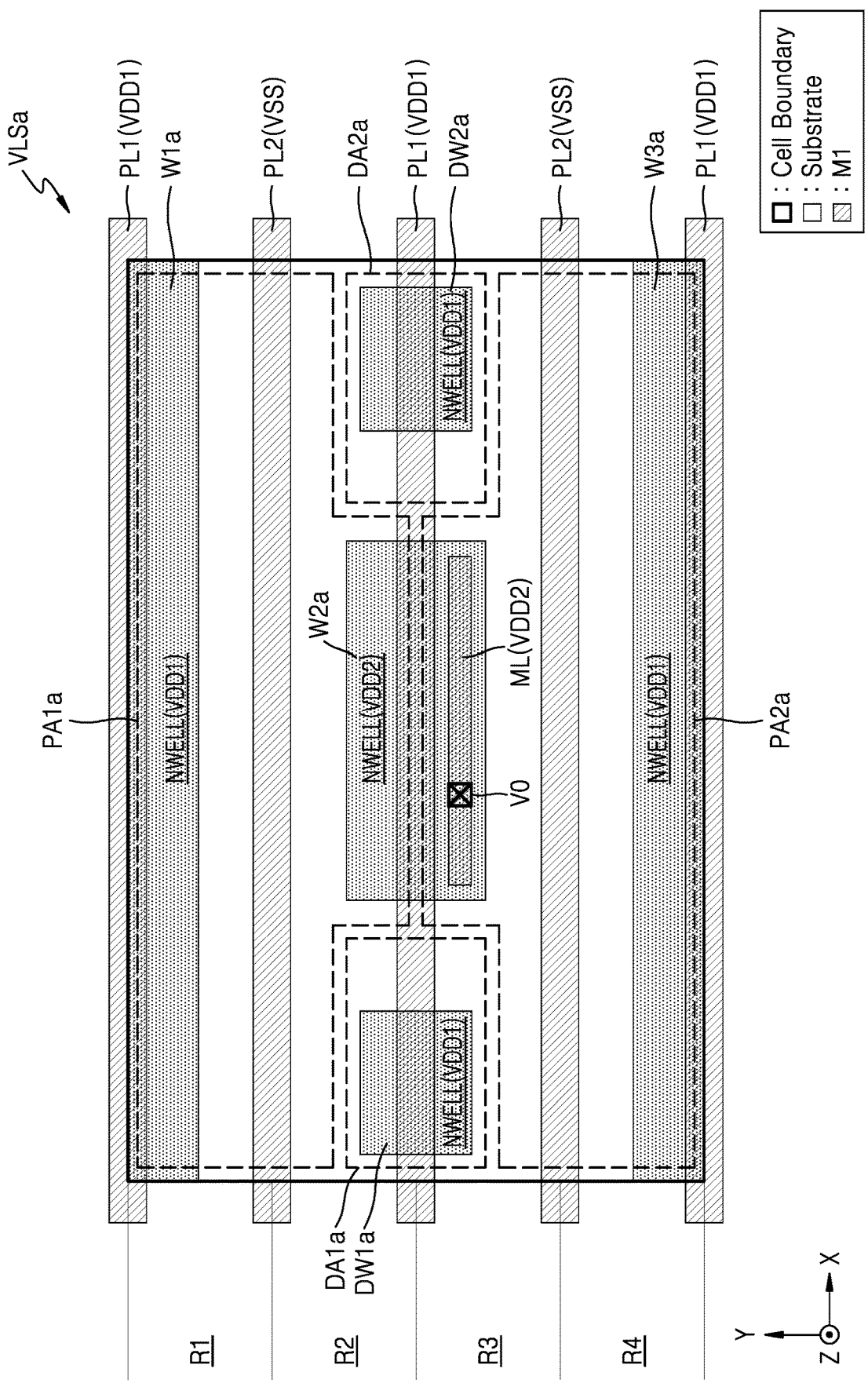

FIG. 4 is a plan view of a layout of a voltage level shifter cell VLSa, according to an exemplary embodiment of the present inventive concept. In the description with reference to FIG. 4, repeated descriptions of the same reference numerals as in FIG. 3 may be omitted.

Referring to FIG. 4, in the voltage level shifter cell VLSa provided by a cell boundary, a multi-bit voltage level shifter converting 2-bit input signals may be formed. The voltage level shifter cell VLSa may include a first circuit area PA1*a* and a second circuit area PA2*a*. For example, in the first circuit area PA1*a*, a first voltage level shifter converting the 1-bit first input signal of the input signals (for example, SI[1:N] in FIG. 1, in this case N is equal to 2) may be formed, and in the second circuit area PA2*a*, the second voltage level shifter converting the 1-bit second input signal of the input signals SI[1:N] may be formed. In an exemplary embodiment of the present inventive concept, the first circuit area PA1*a* may be arranged on the first row R1 and the second row R2, and the second circuit area PA2*a* may be arranged on the third row R3 and the fourth row R4.

The voltage level shifter cell VLSa may include a first well W1*a*, a second well W2*a*, and a third well W3*a*, which are N-wells. The first circuit area PA1*a* may include the first well W1*a*. The second circuit area PA2*a* may include the third well W3*a*, and the first circuit area PA1*a* and the second circuit area PA2*a* may share the second well W2*a*. The first well W1*a* and the third well W3*a* may be biased to the first power voltage VDD1 via the first power lines PL1, and the second well W2*a* may be biased to the second power voltage VDD2 via the metal line ML. The P-type transistors formed in the first well W1*a* and the third well W3*a* may be included in a first portion (for example, P1 in FIG. 2) to which the first power voltage VDD1 is applied, and the P-type transistor formed in the second well W2*a* may be included in a second portion (for example, P2 in FIG. 2) to which the second power voltage VDD2 is applied.

In an exemplary embodiment of the present inventive concept, the first well W1*a* and the third well W3*a*, to which different voltages from each other are applied, may overlap each other in the Y-axis direction, and the second well W2*a* and the third well W3*a*, to which different voltages from each other, are applied may overlap each other in the Y-axis direction. For example, the second well W2a may be arranged between the first well W1a and the third well W3a in the Y-axis direction. The voltage level shifter cell VLSa according to an exemplary embodiment of the present inventive concept may include identical conductivity wells, the first through third wells W1a through W3a, arranged in parallel with each other in the Y-axis direction, and accordingly, a size of the voltage level shifter cell VLSa may be reduced.

The voltage level shifter cell VLSa may further include a first dummy area DA1a and a second dummy area DA2a. According to an exemplary embodiment of the present inventive concept, the first dummy area DA1a may be formed adjacent to the boundary of the voltage level shifter cell VLSa in the −X-axis direction, and the second dummy area DA2a may be formed adjacent to the boundary of the voltage level shifter cell VLSa in the +X-axis direction. For example, the first dummy area DA1a may be formed to contact the boundary of the voltage level shifter cell VLSa in the −X-axis direction, and the second dummy area DA2a may be formed to contact the boundary of the voltage level shifter cell VLSa in the +X-axis direction.

In the first dummy area DA1a and the second dummy area DA2a, a first dummy well DW1a and a second dummy well DW2a, where transistors are not formed, may be formed, respectively. The first dummy area DA1a and the second dummy area DA2a may be areas where a particular voltage (for example, the first power voltage VDD1) is applied to the substrate or the well. For example, the first power voltage VDD1 may be applied to each of the first dummy well DW1a and the second dummy well DW2a. However, unlike as illustrated in FIG. 4, according to an exemplary embodiment of the present inventive concept, the first dummy well DW1a and a second dummy well DW2a may not be formed in the first dummy area DA1a and the second dummy area DA2a, respectively.

The first dummy area DA1a and the second dummy area DA2a may overlap the second well W2a in the X-axis direction, and may be formed in the second row R2 and the third row R3. For example, a portion of the first dummy area DA1a and a portion of the second dummy area DA2a may be formed in the second row R2, and another portion of the first dummy area DA1a and another portion of the second dummy area DA2a may be formed in the third row R3. The first dummy well DW1a and the second dummy well DW2a may be arranged to overlap the second well W2a in the X-axis direction. For example, the second well W2a may be arranged between the first dummy well DW1a and the second dummy well DW2a in the X-axis direction.

Figure 5:
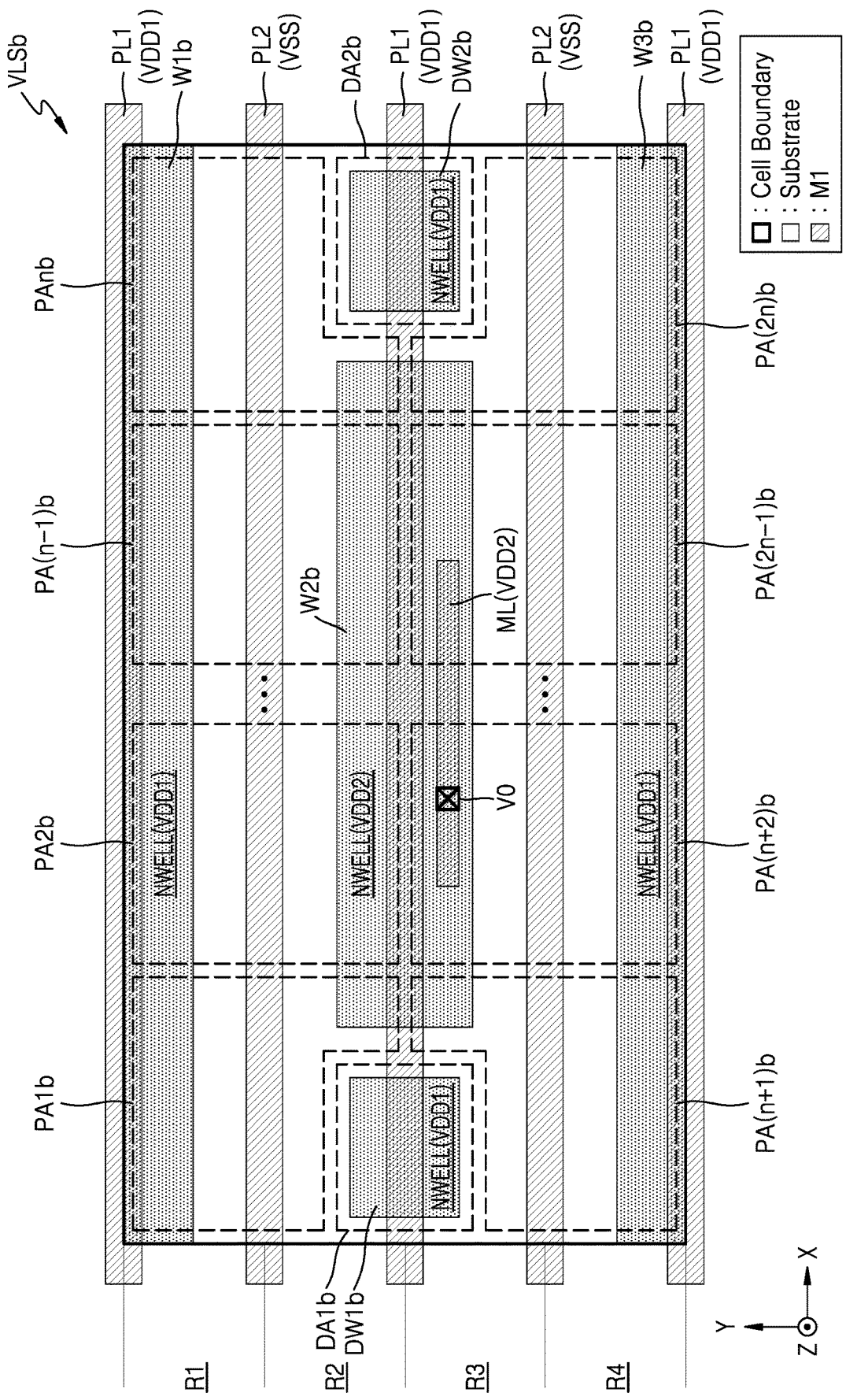

FIG. 5 is a plan view of a layout of a voltage level shifter cell VLSb, according to an exemplary embodiment of the present inventive concept. In the description with reference to FIG. 5, repeated descriptions of the same reference numerals as in FIG. 3 may be omitted.

Referring to FIG. 5, in the voltage level shifter cell VLSb defined by a cell boundary, a multi-bit voltage level shifter converting (2n)-bit input signals may be formed. In this case, n may be a natural number, and when n is equal to 1, the voltage level shifter cell VLSb may be the same as the voltage level shifter cell VLSa of FIG. 4, and when n is equal to 2, the voltage level shifter cell VLSb may be the same as the voltage level shifter cell VLS of FIG. 3.

The voltage level shifter cell VLSb may include first through $(2n)^{th}$ circuit areas PA1b through PA(2n)b, and in each of the first through $(2n)^{th}$ circuit areas PA1b through PA(2n)b, first through $(2n)^{th}$ 1-bit voltage level shifters converting the (2n)-bit input signals (for example, SI[1:N] in FIG. 1, in this case N is equal to 2n) may be formed, respectively. In an exemplary embodiment of the present inventive concept, first through $n^{th}$ circuit areas PA1b through PAnb may be arranged on the first row R1 and the second row R2, and in parallel with each other in the X-axis direction. In an exemplary embodiment of the present inventive concept, $(n+1)^{th}$ through $(2n)^{th}$, circuit areas PA(n+1)b through PA(2n)b may be arranged on the third row R3 and the fourth row R4, and in parallel with each other in the X-axis direction.

The voltage level shifter cell VLSb may include a first well W1b, a second well W2b, and a third well W3b, which are N-wells. The first through $n^{th}$ circuit areas PA1b through PAnb may share the first well W1b. The $(n+1)^{th}$ through $(2n)^{th}$ circuit areas PA(n+1)b through PA(2n)b may share the third well W3b, and the first through $(2n)^{th}$ circuit areas PA1b through PA(2n)b may share the second well W2b.

The first well W1b and the third well W3b may be biased to the first power voltage VDD1 via the first power lines PL1, and the second well W2b may be biased to the second power voltage VDD2 via the metal line ML. The P-type transistors formed in the first well W1b and the third well W3b may be included in a first portion (for example, P1 in FIG. 2) to which the first power voltage VDD1 is applied, and the P-type transistor formed in the second well W2b may be included in a second portion (for example, P2 in FIG. 2) to which the second power voltage VDD2 is applied.

In an exemplary embodiment of the present inventive concept, the first well W1b and the second well W2b, to which different voltages from each other are applied, may overlap each other in the Y-axis direction, and the second well W2b and the third well W3b, to which different voltages from each other are applied, may overlap each other in the Y-axis direction.

The voltage level shifter cell VLSb according to an exemplary embodiment of the present inventive concept may include identical conductivity wells, the first through third wells W1b through W3b, arranged in parallel with each other in the Y-axis direction, and accordingly, a size of the voltage level shifter cell VLSb may be reduced.

The voltage level shifter cell VLSb may further include a first dummy area DA1b and a second dummy area DA2b. According to an exemplary embodiment of the present inventive concept, the first dummy area DA1b may be adjacent to the boundary of the voltage level shifter cell VLSb in the −X-axis direction, and the second dummy area DA2b may be formed adjacent to the boundary of the voltage level shifter cell VLSb in the +X-axis direction. For example, the first dummy area DA1b may be formed to contact the boundary of the voltage level shifter cell VLSb in the −X-axis direction, and the second dummy area DA2b may be formed to contact the boundary of the voltage level shifter cell VLSb in the +X-axis direction.

In the first dummy area DA1b and the second dummy area DA2b, a first dummy well DW1b and a second dummy well DW2b, where transistors are not formed, may be formed, respectively. For example, the first power voltage VDD1 may be applied to each of the first dummy well DW1b and the second dummy well DW2b. However, unlike as illustrated in FIG. 5, in an exemplary embodiment of the present inventive concept, the first dummy well DW1b and the second dummy well DW2b may not be formed in the first dummy area DA1b and the second dummy area DA2b, respectively.

The first dummy area DA1b and the second dummy area DA2b may overlap the second well W2b in the X-axis direction, and may be formed in the second row R2 and the third row R3. The first dummy well DW1b and the second dummy well DW2b may be arranged to overlap the second well W2b in the X-axis direction. For example, the second well W2b may be arranged between the first dummy well DW1b and the second dummy well DW2b.

Figure 6:
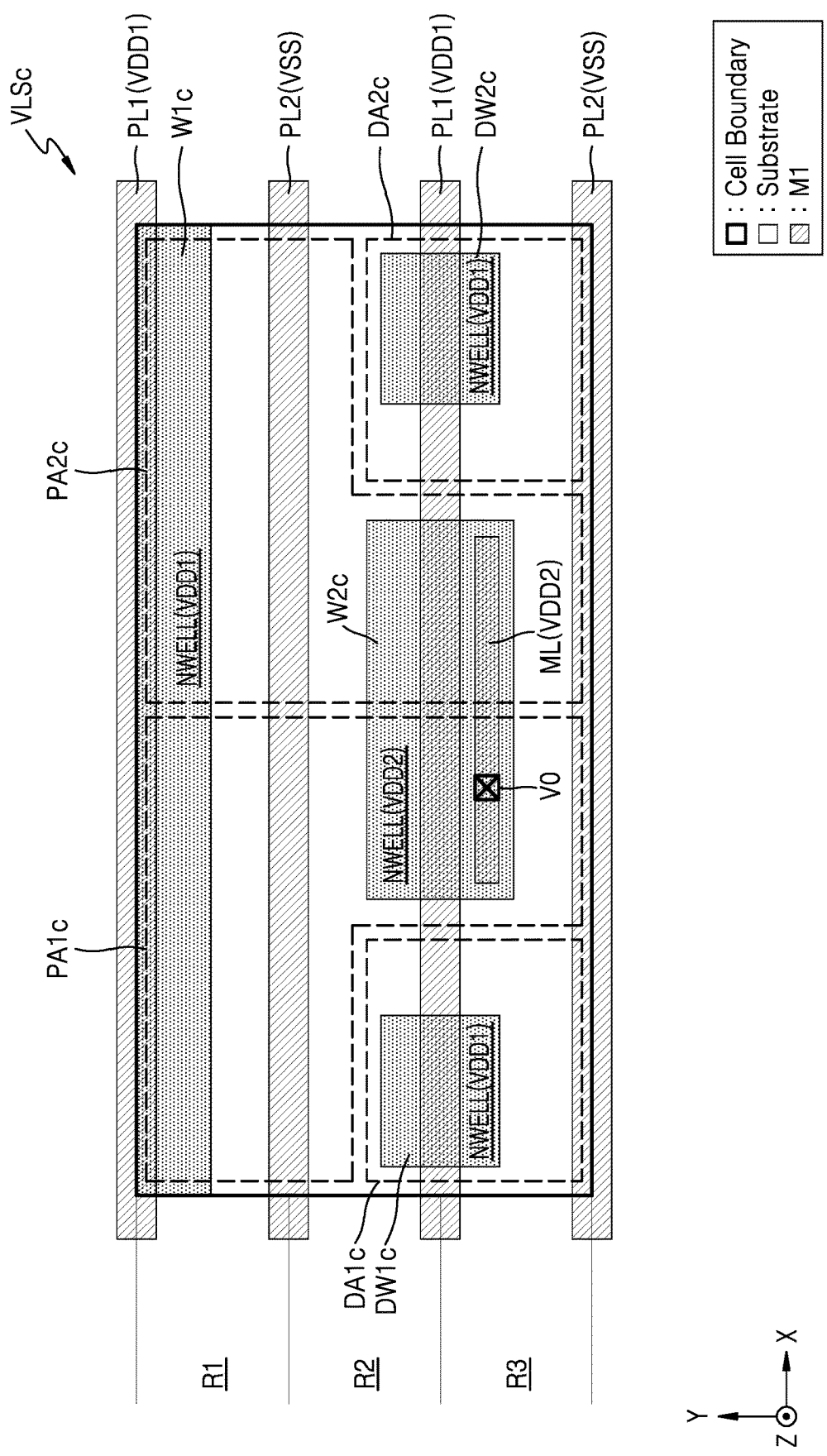

FIG. 6 is a plan view of a layout of a voltage level shifter cell VLSc, according to an exemplary embodiment of the present inventive concept. In the description with reference to FIG. 6, repeated descriptions of the same reference numerals as in FIG. 3 may be omitted.

Referring to FIG. 6, in the voltage level shifter cell VLSc defined by a cell boundary, a multi-bit voltage level shifter converting 2-bit input signals may be formed. The voltage level shifter cell VLSc may include a first circuit area PA1c and a second circuit area PA2c. In the first circuit area PA1c, the first voltage level shifter converting the 1-bit first input signal of an input signal (for example, SI[1:N] in FIG. 1, in this case, N is equal to 2) may be formed, and in the second circuit area PA2c, the second voltage level shifter converting the 1-bit second input signal of an input signal SI[1:2] may be formed.

The voltage level shifter cell VLSc may, as a multi-height cell, be arranged across the first through third rows R1 through R3, and the first through third rows R1 through R3 may be defined by two of the first power lines PL1 and two of the second power lines PL2. In an exemplary embodiment of the present inventive concept, the first circuit area PA1c and the second circuit area PA2c may be arranged across the first through third rows R1 through R3, and the first circuit area PA1c and the second circuit area PA2c may be arranged in parallel with each other in the X-axis direction.

The voltage level shifter cell VLSc may include a first well W1c and a second well W2c. Each of the first circuit area PA1c and the second circuit area PA2c may include a portion of the first well W1c and a portion of the second well W2c. For example, the first circuit area PA1c and the second circuit area PA2c may share the first well W1c and the second well W2c.

The first well W1c may be biased to the first power voltage VDD1 via the first power lines PL1, and the second well W2b may be biased to the second power voltage VDD2 via the metal line ML. The P-type transistor formed in the first well W1b may be included in a first portion (for example, P1 in FIG. 2) of the multi-bit voltage level shifter, to which the first power voltage VDD1 is applied, and the P-type transistor formed in the second well W2b may be included in a second portion (for example, P2 in FIG. 2) of the multi-bit voltage level shifter, to which the second power voltage VDD2 is applied. In an exemplary embodiment of the present inventive concept, the first well W1c and the second well W2c, to which different voltages from each other are applied, may overlap each other in the Y-axis direction.

The voltage level shifter cell VLSc may further include a first dummy area DA1c and a second dummy area DA2c. According to an exemplary embodiment of the present inventive concept, the first dummy area DA1c may be adjacent to the boundary of the voltage level shifter cell VLSc in the −X-axis direction, and the second dummy area DA2c may be adjacent to the boundary of the voltage level shifter cell VLSc in the +X-axis direction. For example, the first dummy area DA1c may be formed to contact the boundary of the voltage level shifter cell VLSc in the −X-axis direction, and the second dummy area DA2c may be formed to contact the boundary of the voltage level shifter cell VLSc in the +X-axis direction. In addition, according to an exemplary embodiment of the present inventive concept, the first dummy area DA1c and the second dummy area DA2c may be formed to contact the boundary of the voltage level shifter cell VLSc in the −Y-axis direction.

In the first dummy area DA1c and the second dummy area DA2c, a first dummy well DW1c and a second dummy well DW2c, where transistors are not formed, may be formed, respectively. The first dummy area DA1c and the second dummy area DA2c may be areas where a particular voltage (for example, the first power voltage VDD1) is applied to the substrate or the well, and for example, the first power voltage VDD1 may be applied to each of the first dummy well DW1c and the second dummy well DW2c. However, unlike as illustrated in FIG. 6, in an exemplary embodiment of the present inventive concept, the first dummy well DW1c and the second dummy well DW2c may not be formed in the first dummy area DA1c and the second dummy area DA2c, respectively.

The first dummy area DA1c and the second dummy area DA2c may overlap the second well W2c in the X-axis direction, and may be formed in the second row R2 and the third row R3. The first dummy well DW1c and the second dummy well DW2c may be arranged to overlap the second well W2c in the X-axis direction.

Figure 7:
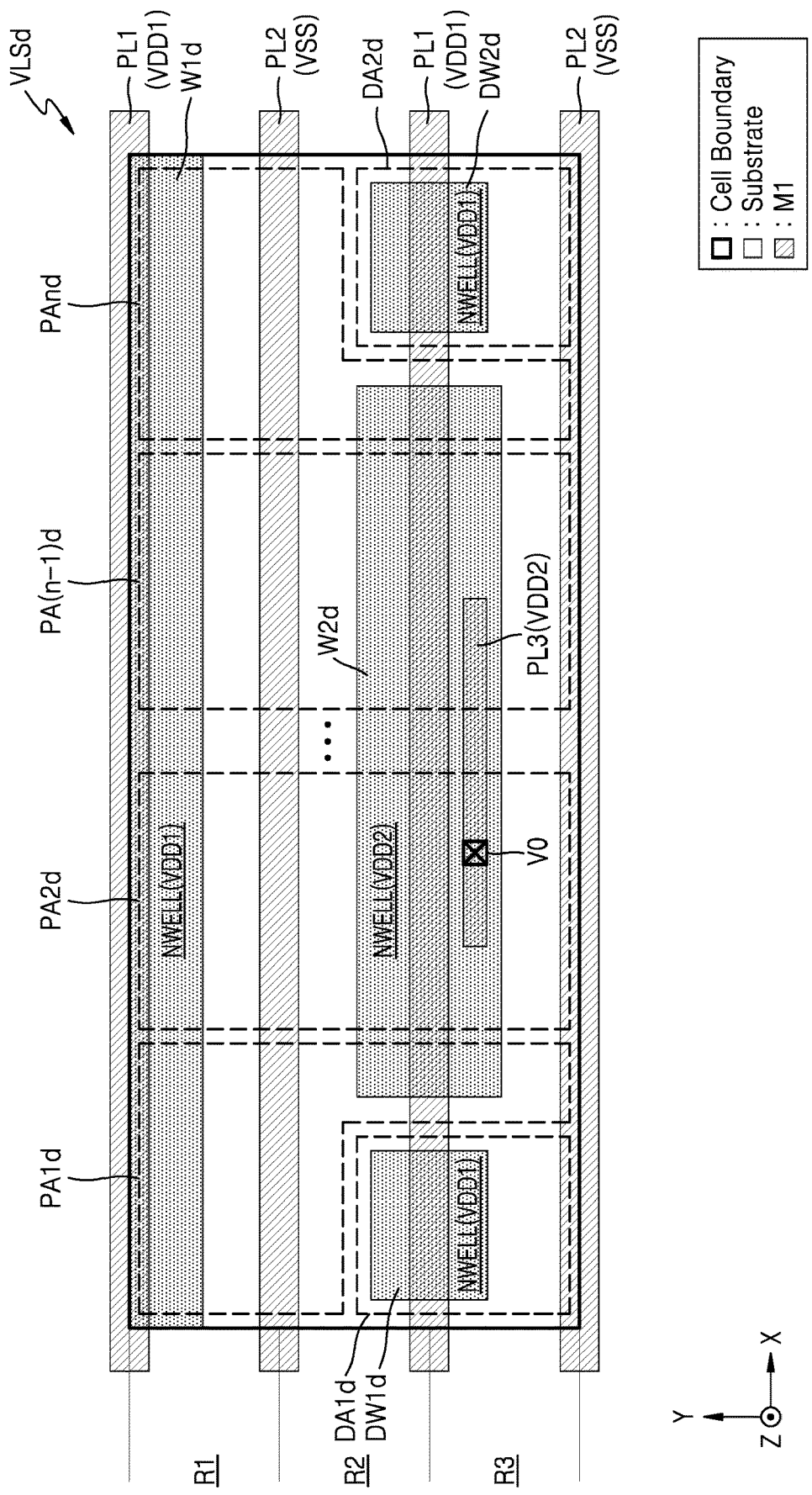

FIG. 7 is a plan view of a layout of a voltage level shifter cell VLSd, according to an exemplary embodiment of the present inventive concept. In the description with reference to FIG. 7, repeated descriptions of the same reference numerals as in FIG. 3 may be omitted.

Referring to FIG. 7, in the voltage level shifter cell VLSd defined by a cell boundary, a multi-bit voltage level shifter converting n-bit input signals may be formed. In this case, n may be a natural number equal to or greater than 2, and when n is equal to 2, the voltage level shifter cell VLSd may be the same as the voltage level shifter cell VLSc of FIG. 6.

The voltage level shifter cell VLSd may include first through $n^{th}$, circuit areas PA1d through PAnd, and in each of the first through $n^{th}$ circuit areas PA1d through PAnd, first through ne 1-bit voltage level shifters converting the n-bit input signals (for example, SI[1:N] in FIG. 1, in this case N is equal to n) may be formed, respectively. In an exemplary embodiment of the present inventive concept, the first through $n^{th}$ circuit areas PA1d through PAnd may be arranged on the first through third rows R1 through R3, and in parallel with each other in the X-axis direction.

The voltage level shifter cell VLSd may include a first well W1d, to which the first power voltage VDD1 is applied, and a second well W2d, to which the second power voltage VDD2 is applied. The first through nth circuit areas PA1d through PAnd may share the first well W1d and the second well W2d. The first well W1d and the second well W2d may overlap each other in the Y-axis direction.

The voltage level shifter cell VLSd may further include a first dummy area DA1d and a second dummy area DA2d. According to an exemplary embodiment of the present inventive concept, the first dummy area DA1d may be formed adjacent to the boundary of the voltage level shifter cell VLSd in the −X-axis direction, and the second dummy area DA2d may be formed adjacent to the boundary of the voltage level shifter cell VLSd in the +X-axis direction. For example, the first dummy area DA1d may be formed to contact the boundary of the voltage level shifter cell VLSd in the −X-axis direction, and the second dummy area DA2d may be formed to contact the boundary of the voltage level shifter cell VLSd in the +X-axis direction. In addition, according to an exemplary embodiment of the present inventive concept, the first dummy area DA1d and the second dummy area DA2d may be formed to contact the boundary of the voltage level shifter cell VLSd in the −Y-axis direction.

In the first dummy area DA1d and the second dummy area DA2d, a first dummy well DW1d and a second dummy well DW2d, where transistors are not formed, may be formed, respectively. The first power voltage VDD1 may be applied to each of the first dummy well DW1d and the second dummy well DW2d. However, unlike as illustrated in FIG. 7, in an exemplary embodiment of the present inventive concept, the first dummy well DW1d and the second dummy well DW2d may not be formed in the first dummy area DA1d and the second dummy area DA2d, respectively.

The first dummy area DA1d and the second dummy area DA2d may overlap the second well W2d in the X-axis direction, and may be formed in the second row R2 and the third row R3. The first dummy well DW1d and the second dummy well DW2d may be arranged to overlap the second well W2d in the X-axis direction.

Figure 8:
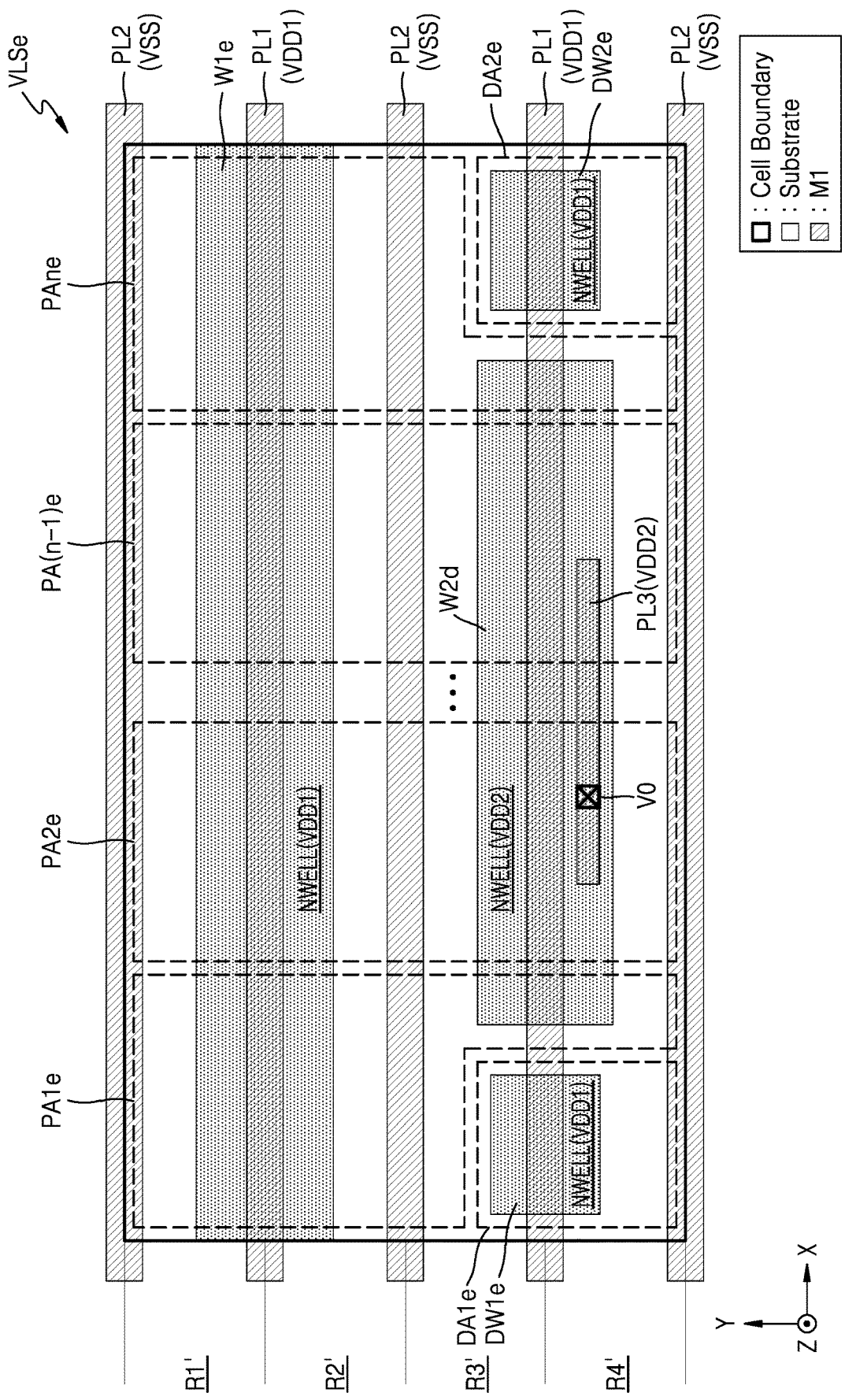

FIG. 8 is a plan view of a layout of a voltage level shifter cell VLSe, according to an exemplary embodiment of the present inventive concept. In the description with reference to FIG. 8, repeated descriptions of the same reference numerals as in FIG. 3 may be omitted.

Referring to FIG. 8, in the voltage level shifter cell VLSe defined by a cell boundary, a multi-bit voltage level shifter converting n-bit input signals may be formed. The voltage level shifter cell VLSe may, as a multi-height cell, be arranged across first through fourth rows R1' through R4'. In this case, the first through fourth rows R1' through R4' may be defined by two of the first power lines PL1 and three of the second power lines PL2.

The voltage level shifter cell VLSe may include first through nth circuit areas PA1e through PAne, and in each of the first through $n^{th}$ circuit areas PA1e through PAne, first through $n^{th}$ 1-bit voltage level shifters converting the n-bit input signals (for example, SI[1:N] in FIG. 1, in this case N is equal to n) may be formed, respectively. In an exemplary embodiment of the present inventive concept, the first through $n^h$ circuit areas PA1e through PAne may be arranged on the first through fourth rows R1' through R4', and in parallel with each other in the X-axis direction.

The voltage level shifter cell VLSe may include a first well W1e, to which the first power voltage VDD1 is applied, and a second well W2e, to which the second power voltage VDD2 is applied. The first well W1e may be formed between the first row R1' and the second row R2', and the second well W2e may be formed between the third row R3' and the fourth row R4'. The first through nth circuit areas PA1e through PAne may share the first well W1e and the second well W2e. The first well W1e and the second well W2e may overlap each other in the Y-axis direction.

The voltage level shifter cell VLSe may further include a first dummy area DA1e and a second dummy area DA2e. According to an exemplary embodiment of the present inventive concept, the first dummy area DA1e may be formed adjacent to the boundary of the voltage level shifter cell VLSe in the −X-axis direction, and the second dummy area DA2e may be formed adjacent to the boundary of the voltage level shifter cell VLSe in the +X-axis direction. For example, the first dummy area DA1e may be formed to contact the boundary of the voltage level shifter cell VLSe in the −X-axis direction, and the second dummy area DA2e may be formed to contact the boundary of the voltage level shifter cell VLSe in the +X-axis direction. In addition, according to an exemplary embodiment of the present inventive concept, the first dummy area DA1e and the second dummy area DA2e may be formed to contact the boundary of the voltage level shifter cell VLSe in the −Y-axis direction.

In the first dummy area DA1e and the second dummy area DA2e, a first dummy well DW1e and a second dummy well DW2e, where transistors are not formed, may be formed, respectively. The first power voltage VDD1 may be applied to each of the first dummy well DW1e and the second dummy well DW2e. However, unlike as illustrated in FIG. 7, in an exemplary embodiment of the present inventive concept, the first dummy well DW1e and the second dummy well DW2e may not be formed in the first dummy area DA1e and the second dummy area DA2e, respectively.

The first dummy area DA1e and the second dummy area DA2e may overlap the second well W2e in the X-axis direction, and may be formed in the third row R3' and the fourth row R4'. The first dummy well DW1e and the second dummy well DW2e may be arranged to overlap the second well W2e in the X-axis direction.

Figure 9:
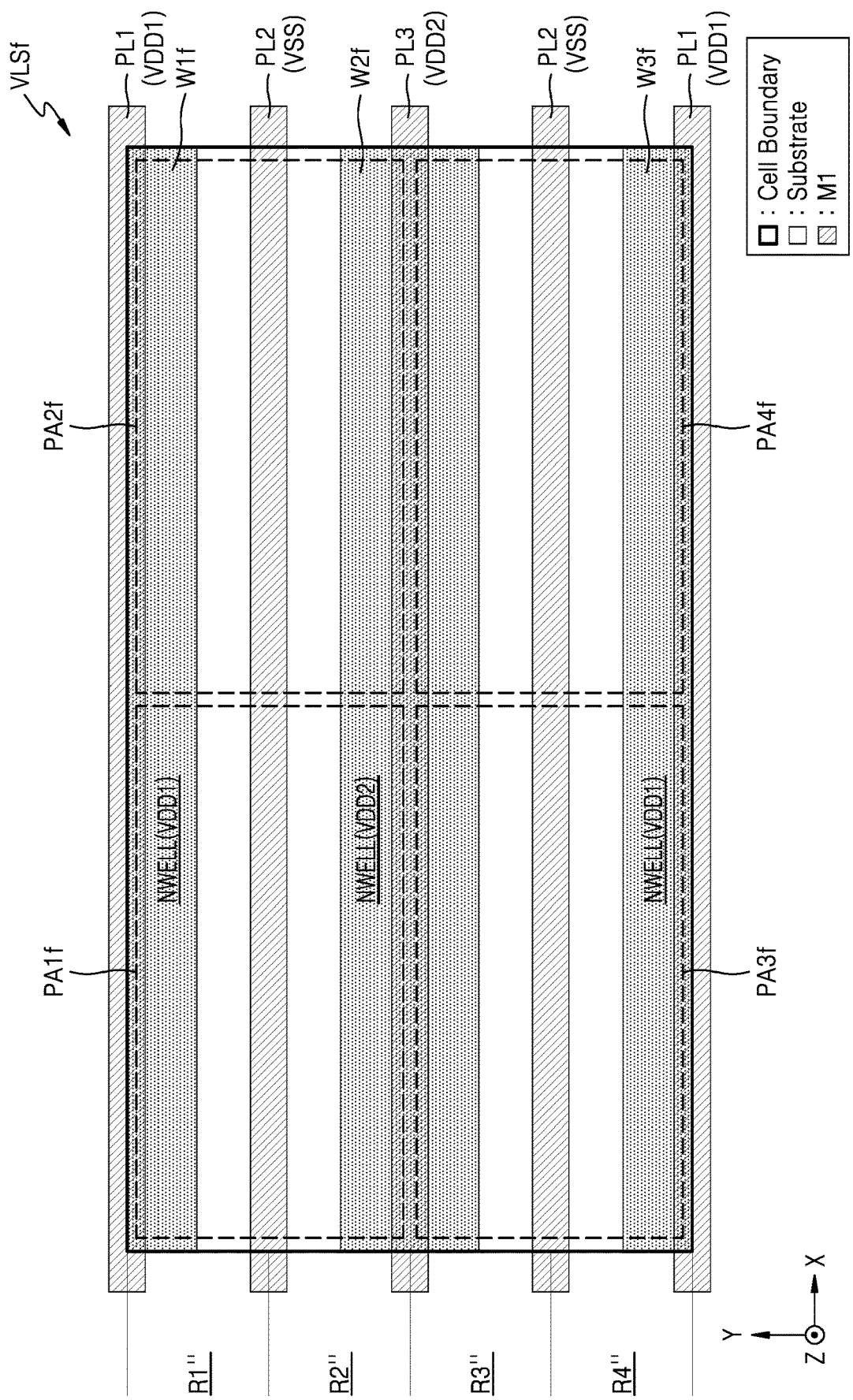

FIG. 9 is a plan view of a layout of a voltage level shifter cell VLSf, according to an exemplary embodiment of the present inventive concept. In the description with reference to FIG. 9, repeated descriptions of the same reference numerals as in FIG. 3 may be omitted.

The integrated circuit (for example, 100 of FIG. 1A and 100' of FIG. 1B) may include the plurality of first power lines PL1 and the plurality of second power lines PL2, and at least one third power line PL3. The at least one third power line PL3 may be configured to include a portion of a third power rail, extend in the X-axis direction, and receive the second power voltage VDD2, the second power voltage VDD2 being different from the first power voltage VDD1. The at least one third power line PL3 may be arranged between two different second power lines PL2, and be arranged apart from the second power lines PL2 in the Y-axis direction. In FIG. 9, an example is illustrated in which the at least one third power line PL3 is formed from patterning of the first metal layer M1, but the integrated circuit according to the present inventive concept is not limited thereto.

Referring to FIG. 9, in the voltage level shifter cell VLSf defined by a cell boundary, a multi-bit voltage level shifter converting input signals including a plurality of bits may be formed. For example, the voltage level shifter cell VLSf may include a multi-bit voltage level shifter cell converting the 4-bit input signals formed therein, but the voltage level shifter cell VLSf according to the present inventive concept is not limited thereto, and may be variously changed together with above-described embodiments.

The voltage level shifter cell VLSf may include the multi-height cell arranged across first through fourth rows R1" through R4", and the first through fourth rows R1" through R4" may be defined by two of the first power lines PL1, two of the second power lines PL2, and one third power line PL3.

The voltage level shifter cell VLSf may include first through fourth circuit areas PA1f through PA4f, and the first through fourth 1-bit voltage level shifters converting the 4-bit input signals (for example, SI[1:N] in FIG. 1, where N is equal to 4) may be formed in the first through fourth circuit areas PA1f through PA4f, respectively. In an exemplary embodiment of the present inventive concept, the first circuit area PA1f and the second circuit area PA2f may be arranged on a first row R1" and a second row R2", and in parallel with each other in the X-axis direction. In an exemplary embodiment of the present inventive concept, the third circuit area PA3f and the fourth circuit area PA4f may be arranged on a third row R3" and a fourth row R4", and in parallel with each other in the X-axis direction.

The voltage level shifter cell VLSf may include a first well W1f, a second well W2f, and a third well W3f. The first power voltage VDD1 is applied to the first well W1f and the third well W3f, and the second power voltage VDD2 is applied to the second well W2f. Each of the first well W1f and the third well W3f may receive the first power voltage VDD1 via the first power lines PL1, and the second well W2f may receive the second power voltage VDD2 via the third power line PL3.

The first well W1f may be formed on the first row R1". The second well W2f may be formed in the second row R2" and the third row R3", and the third well W3f may be formed on the fourth row R4". Each of the first circuit area PA1f and the second circuit area PA2f may include a portion of the first well W1f and a portion of the second well W2f, and each of the third circuit area PA3f and the fourth circuit area PA4f may include a portion of the second well W2f and a portion of the third well W3f. For example, the first circuit area PA1f and the second circuit area PA2f may share the first well W1f. In addition, the third circuit area PA3f and the fourth circuit area PA4f may share the third well W3f, and the first through fourth circuit areas PA1f through PA4f may share the second well W2f.

Figure 10:
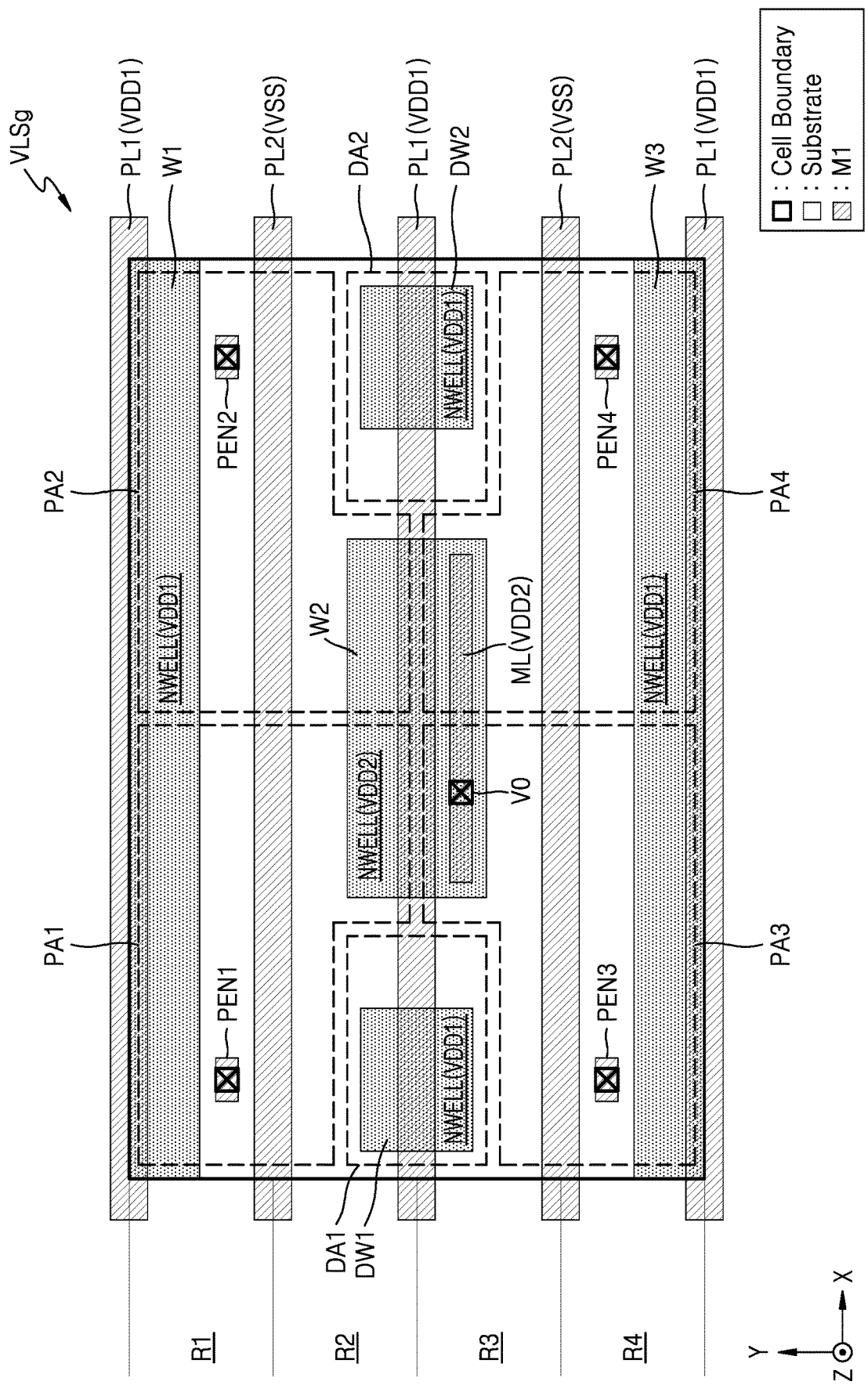
Figure 11:
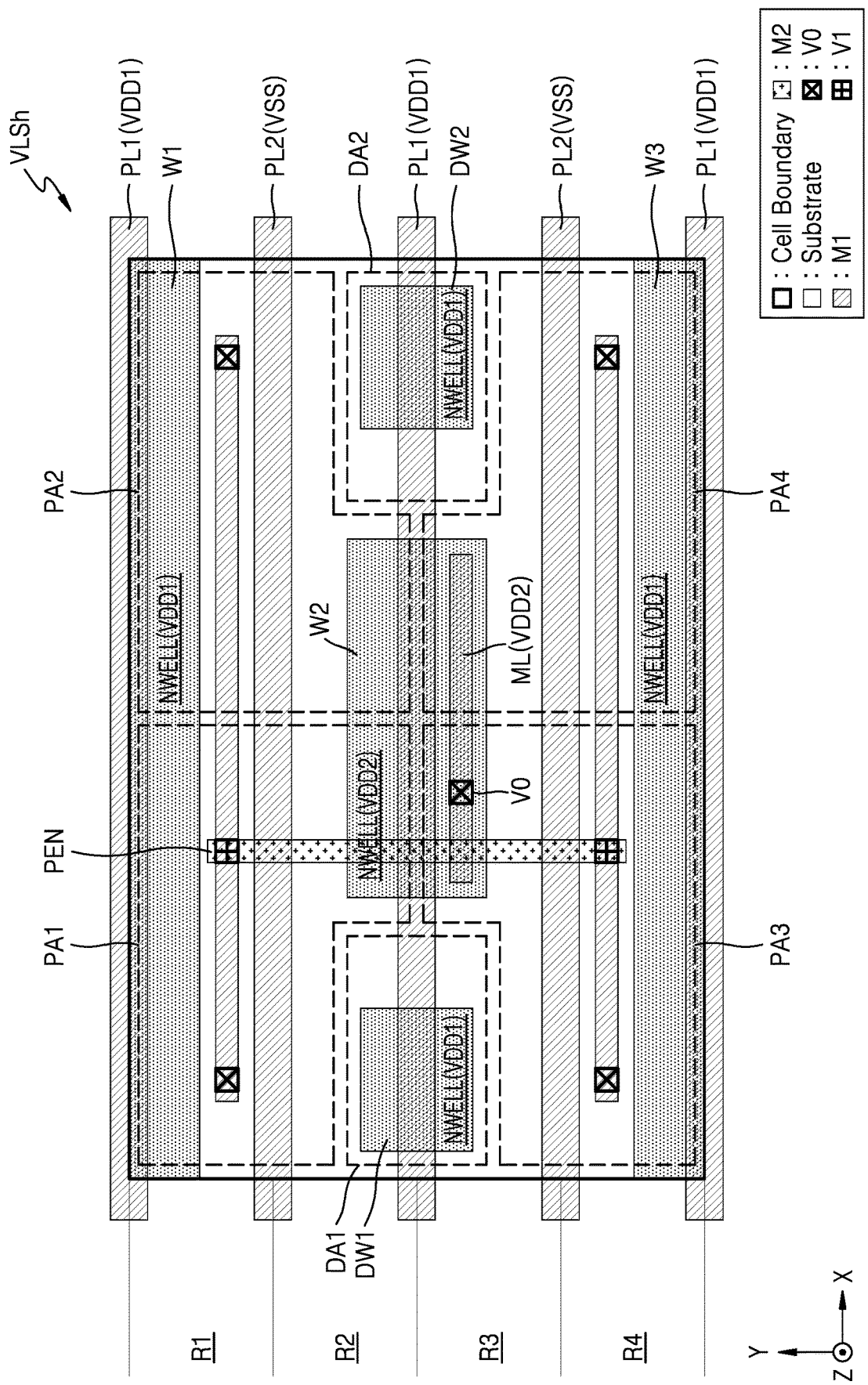

FIGS. 10 and 11 are plan views of layouts of voltage level shifter cells VLSg and VLSh, according to exemplary embodiments of the present inventive concept. In the description with reference to FIGS. 10 and 11, repeated descriptions of the same reference numerals as in FIG. 3 may be omitted. In FIGS. 10 and 11, exemplary embodiments of voltage level shifter cells, in which input pins receiving enable signals are formed in addition to the voltage level shifter cell VLS illustrated in FIG. 3, may be provided, but descriptions of the input pin with reference to FIGS. 10 and 11 may be identically applied to the voltage level shifter cells described with reference to FIGS. 4 through 9.

Referring to FIG. 10, the voltage level shifter cell VLSg may include the first through fourth circuit areas PA1 through PA4. In each of the first through fourth circuit areas PA1 through PA4, the first voltage level shifter converting the 1-bit first input signal, the second voltage level shifter converting the 1-bit second input signal, the third voltage level shifter converting the 1-bit third input signal, and the fourth voltage level shifter converting the 1-bit fourth input signal may be formed.

Operations of first through fourth voltage level shifters may be activated or deactivated according to received first through fourth enable signals, respectively. The first circuit area PA1 may include a first input pin PEN1, to which the first enable signal is input. The first circuit area PA2 may include a second input pin PEN2, to which the second enable signal is input. The third circuit area PA3 may include a third input pin PEN3, to which the third enable signal is input, and the fourth circuit area PA4 may include a fourth input pin PEN4, to which the fourth enable signal is input. The first through fourth enable signals, respectively input to the first through fourth input pins PEN1 through PEN4, may be respectively input to gate lines of the first through fourth circuit areas PA1 through PA4 via the first via VO. In FIG. 10, the first through fourth input pins PEN1 through PEN4 are illustrated as a pattern of the first metal layer M1, but the voltage level shifter cell VLSg according to the present inventive concept is not limited thereto, and may be formed as a pattern of an upper layer of the first metal layer M1.

Referring to FIG. 11, the voltage level shifter cell VLSh may include an input pin PEN, to which an enable signal commonly provided to the first through fourth circuit areas PA1 through PA4 is input. Compared to the voltage level shifter cell VLSg of FIG. 10 including the first through fourth input pins PEN1 through PEN4 for individually and respectively controlling the first through fourth circuit areas PA1 through PA4, the voltage level shifter cell VLSh may include one input pin PEN, and may activate or deactivate first through fourth voltage level shifters of the first through fourth circuit areas PA1 through PA4, respectively, according to the enable signal input to the input pin PEN.

In an exemplary embodiment of the present inventive concept, the input pin PEN may be implemented as a pattern of a second metal layer M2 that is the upper layer of the first metal layer M1. The enable signal input to the input pin PEN may be input to the gate lines of the first through fourth circuit areas PA1 through PA4, the pattern of the first metal layer M1, and the first via VO formed between the first metal layer M1 and the gate line. In addition, the enable signal input to the input pin PEN may be input to the gate lines of the first through fourth circuit areas PA1 through PA4 via a second via V 1 formed between the second metal layer M2 and the first metal layer M1. However, the voltage level shifter cell VLSh according to an exemplary embodiment of the present inventive concept is not limited thereto, and the input pin PEN may be implemented as the pattern of the first metal layer M1, and or may be implemented as a pattern of an upper layer of the second metal layer M2.

Figure 12:
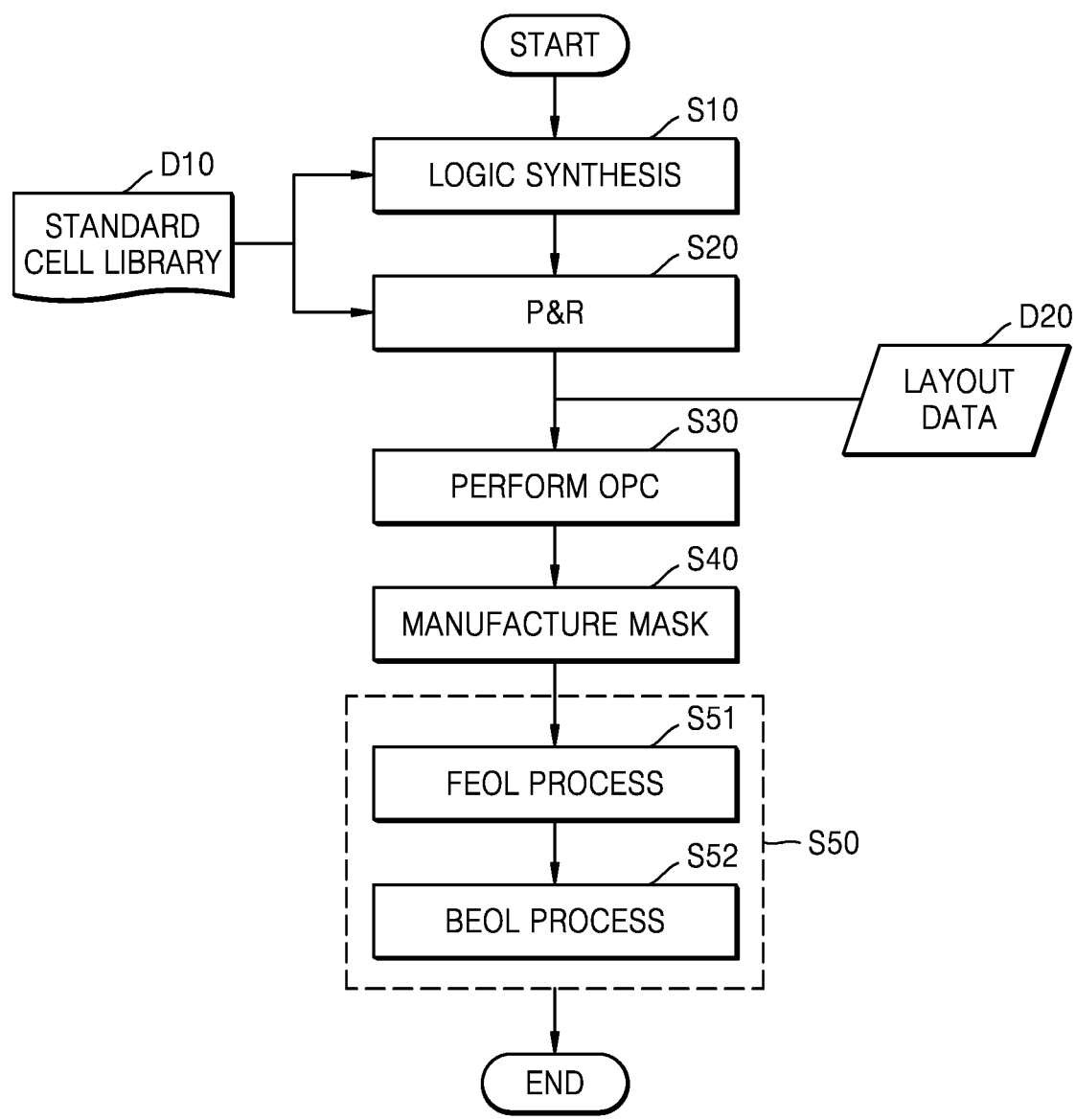
FIG. 12 is a flowchart of a method of fabricating an integrated circuit, according to an exemplary embodiment of the present inventive concept.

FIG. 12 is a flowchart of a method of fabricating an integrated circuit, according to an exemplary embodiment of the present inventive concept.

Referring to FIG. 12, a standard cell library D10 may include information about cells, for example, function information, characteristic information, layout information, and the like. The standard cell library D10 may include data defining a layout of a standard cell. The standard cell library D10 may define voltage level shifter cells (for example, the voltage level shifter cells VLS and VLSa through VLSh described with reference to FIGS. 3 through 11).

A logic synthesis operation of generating netlist data from register-transfer level (RTL) data may be performed (S10). For example, a semiconductor design tool (for example, a logic synthesis tool) may generate a bitstream or netlist data including the netlist, by performing a logic synthesis with reference to the standard cell library D10, from the RTL data that is written in a hardware description language (HDL) such as very-high-speed integrated circuit (VHSIC) HDL (VHDL) and Verilog.

A place & routing (P&R) operation of generating layout data D20 from the netlist data may be performed with reference to the standard cell library D10 (S20). Operation S20 of P&R may arrange the standard cells, generate interconnections, and perform an operation of generating the layout data D20.

For example, the semiconductor design tool (for example, the P&R tool) may arrange a plurality of standard cells by referring to the standard cell library D10 from the netlist data. For example, the semiconductor design tool may, by referring to the standard cell library D10, select one of layouts of the standard cell defined by the netlist data, and arrange the selected layout of the standard cell. For example, the semiconductor design tool may select at least one of the voltage level shifter cell VLS and VLSa through VLSh described with reference to FIGS. 3 through 11, and arrange the selected voltage level shifter cell.

The interconnection may electrically connect the output pins of the standard cell to the input pins of the standard cell and may include, for example, at least one via and at least one routing distribution. The layout data D20 may have a format, for example, a graphic database system information interchange (GDSII), and may include geometric information about the standard cells and the interconnections.

An operation of optical proximity correction (OPC) may be performed (S30). The OPC may be referred to as an operation for forming a pattern of a desired shape by correcting distortion phenomena such as refraction due to light characteristics in photolithography included in a semiconductor process for fabricating an integrated circuit, and a pattern on a mask may be determined by applying the OPC to the layout data D20.

An operation of manufacturing a mask may be performed (S40). For example, as the OPC is applied to the layout data D20, patterns on the mask may be defined to form patterns formed on a plurality of layers, and at least one mask (or, e.g., photomask) for forming the pattern of each of the plurality of layers may be manufactured.

An operation of fabricating the integrated circuit may be performed (S50). For example, the integrated circuit may be fabricated by patterning the plurality of layers by using the at least one mask manufactured in operation S40. Operation S50 may include operations S51 and S52.

A process of front-end-of-line (FEOL) may be performed (S51). The FEOL may be referred to as a process of forming individual elements, for example, transistors, capacitors, resistors, or the like, on the substrate in the fabricating process of the integrated circuit.

A back-end-of-line (BEOL) process may be performed (S52). The BEOL may be referred to as a process of interconnecting individual elements, for example, transistors, capacitors, resistors, or the like to one another, in the fabricating process of the integrated circuit.

Figure 13:
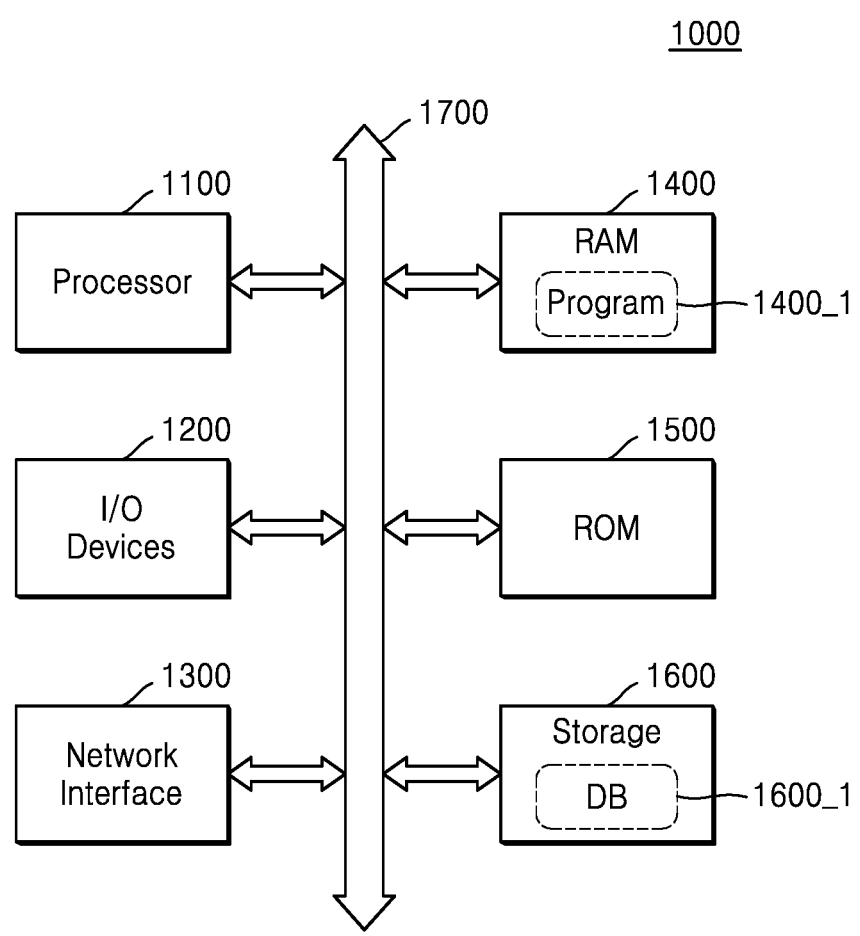
FIG. 13 is a block diagram illustrating a computing system including a memory for storing a program, according to an exemplary embodiment of the present inventive concept.

FIG. 13 is a block diagram illustrating a computing system 1000 including a memory for storing a program, according to an exemplary embodiment of the present inventive concept. According to an exemplary embodiment of the present inventive concept, at least a portion of the operations included in a method of fabricating the integrated circuit (for example, a method of fabricating the integrated circuit in FIG. 12) may be performed by the computing system 1000.

Referring to FIG. 13, the computing system 1000 may include a stationary computing system such as a desktop computer, a work station, and a server, or a portable computing system such as a laptop computer. The computing system 1000 may include a processor 1100, input/output (I/O) devices 1200, a network interface 1300, random access memory (RAM) 1400, read-only memory (ROM) 1500, and a storage 1600. The processor 1100, the I/O devices 1200, the network interface 1300, the RAM 1400, the ROM 1500, and the storage 1600 may communicate with each other via a bus 1700.

The processor 1100 may be referred to as a processing unit, and may include at least one core capable of performing an arbitrary command set. For example, the processor 1100 may include a micro-processor, an application processor (AP), a digital signal processor (DSP), and a graphics processing unit (GPU). For example, the processor 1100 may access a memory, for example, the RAM 1400 or the ROM 1500, via the bus 1700, and may execute commands stored in the RAM 1400 or the ROM 1500.

The RAM 1400 may store a program 1400_1 or at least a portion thereof for fabricating the integrated circuit according to an exemplary embodiment of the present inventive concept. For example, the program 1400_1 may include a semiconductor design tool, for example, a logical synthesis tool and a P & R tool.

The program 1400_1 may cause the processor 1100 to perform at least some operations included in the method of fabricating the integrated circuit in FIG. 12. For example, the program 1400_1 may include a plurality of commands executable by the processor 1100, and a plurality of commands included in the program 1400_1 may cause the processor 1100 to perform at least some operations included in the method of fabricating the integrated circuit in FIG. 12.

The storage 1600 may not lose stored data even when the power supplied to the computing system 1000 is cut off. For example, the storage 1600 may include a non-volatile memory device, and may also include a storage medium such as magnetic tape, an optical disk, and a magnetic disk. The storage 1600 may store the program 1400_1 according to an exemplary embodiment of the present inventive concept, and before the program 1400_1 is executed by the processor 1100, the program 1400_1 or at least a portion of the program 1400_1 may be loaded to the RAM 1400 from the storage 1600. In addition, the storage 1600 may store a file written in a program language, and the program 1400_1 generated from the file by a compiler or the like, or at least a portion of the program 1400_1 may be loaded to the RAM 1400.

The storage 1600 may store a database (DB) 1600_1, and the DB 1600_1 may include information for designing the integrated circuit. For example, the DB 1600_1 may include the standard cell library D10 in FIG. 12. In addition, the storage 1600 may store data to be processed by the processor 1100 or data processed by the processor 1100.

The I/O devices 1200 may include an input device such as a keyboard and a pointing device, and may include an output device such as a display device and a printer. The network interface 1300 may provide access to a network outside the computing system 1000.

According to an exemplary embodiment of the present inventive concept, a voltage level shifter cell and an integrated circuit including the same is provided, and a multi-bit voltage level shifter cell having a reduced area and an integrated circuit including the same is provided.

While the present inventive concept has been described with reference to embodiments thereof, it will be understood by those of ordinary skill in the art that various changes in form and details may be made thereto without departing from the spirit and scope of the present inventive concept.

What is claimed is:

1. A voltage level shifter cell configured to convert voltage levels of input signals of multi-bits, the voltage level shifter cell comprising:
   a first circuit area including a first voltage level shifter configured to convert a 1-bit first input signal from among the input signals; and
   a second circuit area including a second voltage level shifter configured to convert a 1-bit second input signal from among the input signals,
   wherein the first circuit area and the second circuit area share a first N-well to which a first power voltage is applied, and the first circuit area and the second circuit area share a second N-well to which a second power voltage is applied,
   wherein the first N-well is formed to extend in a first direction, and the first N-well and the second N-well are arranged to overlap in a second direction crossing the first direction.

2. The voltage level shifter cell of claim 1, further comprising:
a third circuit area including a third voltage level shifter configured to convert a 1-bit third input signal from among the input signals; and
a fourth circuit area including a fourth voltage level shifter configured to convert a 1-bit fourth input signal from among the input signals,
wherein the third circuit area and the fourth circuit area share the second N-well.

3. The voltage level shifter cell of claim 2, wherein the third circuit area and the fourth circuit area share a third N-well, to which the first power voltage is applied, and the third N-well overlaps the second N-well in the second direction.

4. The voltage level shifter cell of claim 2, wherein the third circuit area and the fourth circuit area share the first N-well.

5. The voltage level shifter cell of claim 1, wherein the first circuit area comprises a first input pin to which a first enable signal configured to control an operation of the first voltage level shifter is input, and
the second circuit area comprises a second input pin to which a second enable signal controlling an operation of the second voltage level shifter is input.

6. The voltage level shifter cell of claim 1, wherein the voltage level shifter cell comprises an input pin to which an enable signal controlling an operation of the voltage level shifter cell is applied, and
the enable signal is applied to a gate line in each of the first circuit area and the second circuit area.

7. The voltage level shifter cell of claim 1, wherein the first circuit area and the second circuit area are arranged on two rows provided by power lines.

8. The voltage level shifter cell of claim 1, wherein the first circuit area and the second circuit area are arranged on three rows provided by power lines.

9. The voltage level shifter cell of claim 1, wherein the first circuit area and the second circuit area are arranged on four rows provided by power lines.

10. A voltage level shifter cell comprising:
a first N-well receiving a first power voltage; and
a second N-well receiving a second power voltage is applied, wherein the second power voltage is different from the first power voltage,
wherein the first N-well receives the first power voltage from a first power line formed to extend in a first direction, and
the first N-well and the second N-well are formed to overlap each other in a second direction substantially perpendicular to the first direction.

11. The voltage level shifter cell of claim 10, further comprising a third N-well receiving the first power voltage, and overlapping each of the first N-well and the second N-well in the second direction.

12. The voltage level shifter cell of claim 10, further comprising a metal line configured to apply the second power voltage to the second N-well,
wherein the metal line is arranged between the first power line and a second power line, wherein the second power line provides a ground voltage.

13. The voltage level shifter cell of claim 10, wherein the second N-well receives the second power voltage from a third power line formed to extend in the first direction, and the third power line is arranged between two of second power lines, each of which provides a ground voltage.

14. The voltage level shifter cell of claim 10, further comprising: a first dummy area formed to be adjacent to a cell boundary of the voltage level shifter cell in the first direction; and
a second dummy area formed to be adjacent to the cell boundary of the voltage level shifter cell in the first direction; and
wherein each of the first dummy area and the second dummy area is formed to overlap the second N-well in the first direction.

15. The voltage level shifter cell of claim 14, wherein the first dummy area comprises a first dummy N-well, and the second dummy area comprises a second dummy N-well, and
wherein the first dummy N-well and the second dummy N-well receive the first power voltage.

16. An integrated circuit comprising:
a first standard cell comprised in a first power voltage domain;
a second standard cell comprised in a second power voltage domain; and
a voltage level shifter cell configured to convert voltage levels of input signals of multi-bits input from the second standard cell to output signals, and configured to output the output signals to the first standard cell,
wherein the voltage level shifter cell comprises:
a first N-well receiving a first power voltage and extending in a first direction; and
a second N-well receiving a second power voltage,
wherein the first N-well and the second N-well overlap each other in a second direction substantially perpendicular to the first direction.

17. The integrated circuit of claim 16, wherein the voltage level shifter cell further comprises a third N-well receiving the first power voltage and overlapping each of the first N-well and the second N-well in the second direction.

18. The integrated circuit of claim 16, wherein the voltage level shifter cell further comprises a metal line applying the second power voltage to the second N-well,
wherein the metal line is arranged between a first power line and a second power line, wherein the first power line provides the first power voltage, and the second power line provides a ground voltage.

19. The integrated circuit of claim 16, further comprising:
a first power line providing the first power voltage to the voltage level shifter cell;
a second power line providing a ground voltage to the voltage level shifter cell; and
a third power line providing the second power voltage to the voltage level shifter cell.

20. The integrated circuit of claim 16, wherein the voltage level shifter cell further comprises:
a first dummy area formed to be in contact with a cell boundary of the voltage level shifter cell; and
a second dummy area formed to be in contact with the cell boundary of the voltage level shifter cell,
wherein each of the first dummy area and the second dummy area overlaps the second N-well in the first direction.

* * * * *